(12) United States Patent
Yamamoto

(10) Patent No.: US 11,990,869 B2
(45) Date of Patent: May 21, 2024

(54) CIRCUIT DEVICE AND OSCILLATOR

(71) Applicant: Seiko Epson Corporation, Tokyo (JP)

(72) Inventor: Takehiro Yamamoto, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 155 days.

(21) Appl. No.: 17/562,073

(22) Filed: Dec. 27, 2021

(65) Prior Publication Data
US 2022/0209717 A1 Jun. 30, 2022

(30) Foreign Application Priority Data
Dec. 28, 2020 (JP) ................................. 2020-218553

(51) Int. Cl.
*H03B 28/00* (2006.01)
*G06F 1/02* (2006.01)
*H03H 9/19* (2006.01)

(52) U.S. Cl.
CPC ............. *H03B 28/00* (2013.01); *G06F 1/022* (2013.01); *H03H 9/19* (2013.01); *H03B 2200/0034* (2013.01)

(58) Field of Classification Search
CPC .......... G11C 7/222; G11C 7/225; G06F 1/04; G06F 1/26; G06F 1/263; G06F 1/266; G06F 1/28; G06F 1/30; G06F 1/305; H03B 28/00; H03B 2200/0034; H03H 9/19
See application file for complete search history.

(56) References Cited

U.S. PATENT DOCUMENTS 6,125,157 A * 9/2000 Donnelly ................... G06F 1/10
 327/158
2003/0098749 A1 5/2003 Terasawa et al.
2020/0313614 A1* 10/2020 Sawada ................... H03B 5/368

FOREIGN PATENT DOCUMENTS

JP 2003-338710 A 11/2003
JP 2013-021388 A 1/2013

* cited by examiner

*Primary Examiner* — Diana J. Cheng
(74) *Attorney, Agent, or Firm* — Harness, Dickey & Pierce, P.L.C.

(57) ABSTRACT

A circuit device includes an oscillation circuit configured to oscillate a resonator to thereby generate an oscillation signal, a waveform shaping circuit to which the oscillation signal is input, and which is configured to output a clock signal obtained by performing waveform shaping on the oscillation signal, a first duty adjustment circuit configured to perform a duty adjustment of the clock signal, and an output buffer circuit configured to output a first output clock signal and a second output clock signal to an outside based on the clock signal. The output buffer circuit includes a second duty adjustment circuit configured to perform a duty adjustment of the second output clock signal.

10 Claims, 16 Drawing Sheets

CIRCUIT DEVICE AND OSCILLATOR

The present application is based on, and claims priority from JP Application Serial Number 2020-218553, filed Dec. 28, 2020, the disclosure of which is hereby incorporated by reference herein in its entirety.

BACKGROUND

1. Technical Field

The present disclosure relates to a circuit device, an oscillator, and so on.

2. Related Art

In the past, there has been known a circuit device having an oscillation circuit for oscillating a resonator such as a quartz crystal resonator. In such a circuit device, it is desired to make a duty ratio of a clock signal generated based on an oscillation signal high in accuracy. In JP-A-2013-21388 (Document 1), for example, there is disclosed a CMOS inverter circuit which inputs a control signal to a control terminal of a switch coupled to one of sources of a PMOS transistor and an NMOS transistor after inputting an input signal to an input terminal to thereby hold a voltage of the input signal, and thus, performs a duty correction of an output signal.

However, in the configuration in Document 1, a high-accuracy duty adjustment of the clock signal is difficult. For example, it is difficult to realize the high-accuracy duty adjustment while realizing a multi-output function of the clock signal.

SUMMARY

An aspect of the present disclosure relates to a circuit device including an oscillation circuit which is electrically coupled to a first node to electrically be coupled to one end of a resonator and a second node to electrically be coupled to another end of the resonator, and is configured to oscillate the resonator to generate an oscillation signal, a waveform shaping circuit which is coupled to the first node, to which the oscillation signal is input from the first node, and which is configured to output a clock signal obtained by performing waveform shaping on the oscillation signal, a first duty adjustment circuit configured to perform a duty adjustment of the clock signal, and an output buffer circuit configured to output a first output clock signal and a second output clock signal to an outside based on the clock signal, wherein the output buffer circuit includes a second duty adjustment circuit configured to perform a duty adjustment of the second output clock signal.

Further, another aspect of the present disclosure relates to an oscillator including the circuit devices described above, and the resonator.

DESCRIPTION OF AN EXEMPLARY EMBODIMENT

The present embodiment will hereinafter be described. It should be noted that the present embodiment described below does not unreasonably limit the contents set forth in the appended claims. Further, all of the constituents described in the present embodiment are not necessarily essential elements.

1. Circuit Device

Figure 1:
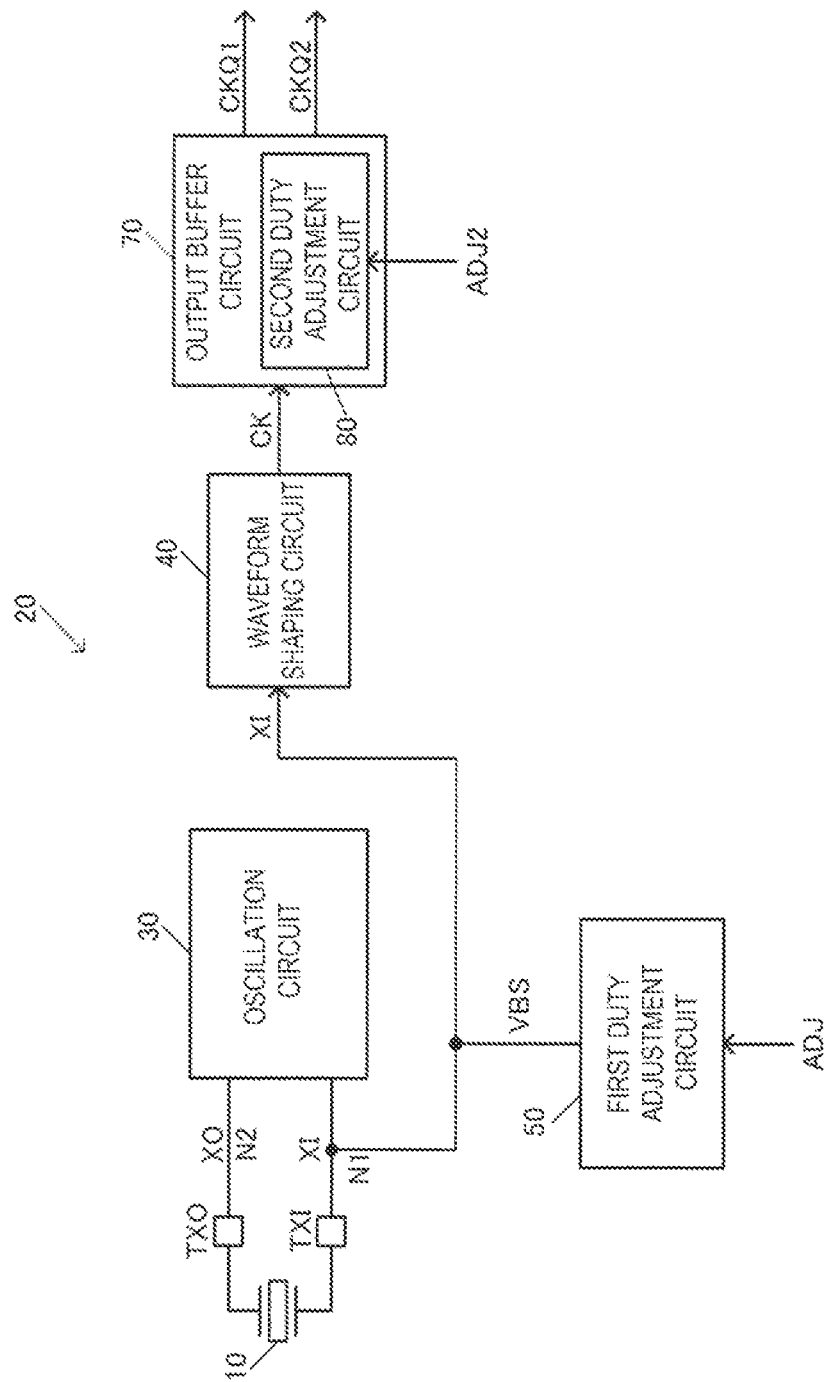
FIG. 1 is a diagram showing a configuration example of a circuit device according to an embodiment.

FIG. 1 shows a configuration example of a circuit device 20 according to the present embodiment. The circuit device 20 according to the present embodiment includes an oscillation circuit 30, a waveform shaping circuit 40, a first duty adjustment circuit 50, and an output buffer circuit 70, and the output buffer circuit 70 includes a second duty adjustment circuit 80. Further, as described with reference to FIG. 22 described later, an oscillator 4 according to the present embodiment includes a resonator 10 and the circuit device 20. The resonator 10 is electrically coupled to the circuit device 20. The resonator 10 and the circuit device 20 are electrically coupled to each other using, for example, internal interconnections of a package for housing the resonator 10 and the circuit device 20, bonding wires, or metal bumps.

The resonator 10 is an element for generating a mechanical vibration due to an electrical signal. The resonator 10 can be realized by a resonator element such as a quartz crystal resonator element. The resonator 10 can be realized by, for example, a quartz crystal resonator element which has a cutting angle of AT-cut or SC-cut, and vibrates in a thickness-shear mode, a tuning-fork quartz crystal resonator element, or a double tuning-fork quartz crystal resonator element. The resonator 10 can be, for example, a resonator incorporated in a temperature-compensated crystal oscillator (TCXO) not equipped with a constant-temperature oven, or a resonator incorporated in an oven-controlled crystal oscillator (OCXO) equipped with a constant-temperature oven. Alternatively, the resonator 10 can be a resonator incorporated in an oscillator such as an SPXO (Simple Packaged Crystal Oscillator). It should be noted that the resonator 10 according to the present embodiment can be realized by a variety of resonator elements such as a resonator element other than the thickness-shear vibration type, the tuning-fork type, or the double tuning-fork type, or a piezoelectric resonator element formed of a material other than quartz crystal. As the resonator 10, it is also possible to adopt, for example, a surface acoustic wave (SAW) resonator, or an MEMS (micro electro-mechanical systems) resonator as a silicon resonator formed using a silicon substrate.

The circuit device 20 is an integrated circuit device called an IC (Integrated Circuit). For example, the circuit device 20 is an IC manufactured using a semiconductor process, and a semiconductor chip having circuit elements formed on a semiconductor substrate.

The oscillation circuit 30 is a circuit for oscillating the resonator 10. For example, the oscillation circuit 30 is electrically coupled to a first node N1 electrically coupled to one end of the resonator 10, and a second node N2 electrically coupled to the other end of the resonator 10, and oscillates the resonator 10 to thereby generate oscillation signals XI, XO. Specifically, the oscillation circuit 30 is electrically coupled to a terminal TXI electrically coupled to the one end of the resonator 10, and a terminal TXO electrically coupled to the other end of the resonator 10, and oscillates the resonator 10 to thereby generate the oscillation signals XI, XO. The terminal TXI corresponds to a first terminal, and the terminal TXO corresponds to a second terminal. The terminals TXI, TXO are, for example, pads of the circuit device 20 which is an IC. The oscillation circuit 30 can be realized by, for example, a drive circuit for oscillation disposed between the terminal TXI and the terminal TXO, and passive elements such as a capacitor and a resistor. The drive circuit can be realized by, for example, a COMS inverter circuit or a bipolar transistor. The drive circuit is a core circuit of the oscillation circuit 30, and the drive circuit performs voltage drive or current drive of the resonator 10 to thereby oscillate the resonator 10. As the oscillation circuit 30, there can be used a variety of types of oscillation circuit such as an inverter type, a Pierce type, a Colpitts type, and a Hartley type. Further, the oscillation circuit 30 is provided with a variable capacitance circuit so that the oscillation frequency can be adjusted by adjusting the capacitance of the variable capacitance circuit. The variable capacitance circuit can be realized by a variable capacitance element such as a varactor. Alternatively, it is possible to realize the variable capacitance circuit with a capacitor array having binary-weighted capacitance values and a switch array coupled to the capacitor array. The variable capacitance circuit is electrically coupled to a first signal line to which, for example, the terminal TXI is coupled. The oscillation circuit 30 can be provided with a first variable capacitance circuit to electrically be coupled to the first signal line to which the terminal TXI is coupled, and a second variable capacitance circuit to electrically be coupled to a second signal line to which the terminal TXO is coupled. It should be noted that the coupling in the present embodiment is electrical coupling. The electrical coupling means coupling capable of transmitting an electrical signal, and is coupling with which transmission of information by the electrical signal is achievable. The electrical coupling can also be coupling via a passive element or the like.

The waveform shaping circuit 40 is a circuit for performing waveform shaping of the oscillation signal XI, and is a buffer circuit to which the oscillation signal XI is input, and which outputs a clock signal CK. For example, the waveform shaping circuit 40 is coupled to the first node N1 so that the oscillation signal XI is input from the first node N1, and outputs the clock signal CK obtained by performing the waveform shaping on the oscillation signal XI. For example, the waveform shaping circuit 40 performs the waveform shaping on the oscillation signal XI as a sine wave to output the clock signal CK as a rectangular wave. The waveform shaping circuit 40 is constituted by, for example, a plurality of inverter circuits.

The first duty adjustment circuit 50 is a circuit for performing a duty adjustment of the clock signal CK. The first duty adjustment circuit 50 can be said to be a bias voltage adjustment circuit for adjusting a bias voltage VBS. For example, the first duty adjustment circuit 50 supplies the first node N1 with the bias voltage VBS which is variably adjusted based on adjustment data ADJ to thereby adjust a duty ratio of the clock signal CK. By the duty ratio of the clock signal CK being adjusted, duty ratios of output clock signals CKQ1, CKQ2 of the circuit device 20 shown in FIG. 2 described later are also adjusted as a result. The duty ratio is also called a duty cycle. It should be noted that in the present embodiment, the duty ratio is described simply as duty in some cases. The first duty adjustment circuit 50 generates the bias voltage VBS having a first voltage value corresponding to a first adjustment value when, for example, the adjustment data ADJ represents the first adjustment value, and generates the bias voltage VBS having a second voltage value corresponding to a second adjustment value when the adjustment data ADJ represents the second adjustment value. In other words, the first duty adjustment circuit 50 supplies the first node N1 with the bias voltage VBS the voltage value of which is variably set in accordance with the adjustment data ADJ.

By the first duty adjustment circuit 50 supplying the bias voltage VBS to the first node N1 as an output node of the oscillation signal XI, the oscillation signal XI becomes an AC signal which varies centering on the bias voltage VBS. For example, the oscillation signal XI becomes an AC signal with a DC component cut by a capacitor not shown, and the central voltage of the AC signal is set by the bias voltage VBS from the first duty adjustment circuit 50. Further, by the oscillation signal XI in which the bias voltage VBS is set in such a manner being input to the waveform shaping circuit 40 to thereby be shaped in waveform, the clock signal CK as a rectangular wave is generated.

In this case, the adjustment data ADJ is set to the adjustment value with which the duty ratio of the clock signal CK becomes, for example, 50%. When, for example, the fluctuation of the manufacturing process of the semiconductor is typical, the adjustment data ADJ is set to the adjustment value with which the bias voltage VBS is set to a voltage about a half of a power supply voltage of the waveform shaping circuit 40. Further, the adjustment value of the adjustment data ADJ is set so that the duty ratio of the clock signal CK becomes 50% even when the process fluctuation of a P-type transistor or an N-type transistor constituting the inverter circuit provided to the waveform shaping circuit 40 is "Fast" or "Slow." In this way, it becomes possible to generate the clock signal CK adjusted to have the duty ratio of 50% even when the process fluctuation occurs.

The output buffer circuit 70 outputs the output clock signals CKQ1, CKQ2 to the outside based on the clock signal CK. For example, the output buffer circuit 70 buffers the clock signal CK and then outputs the clock signal CK as the output clock signals CKQ1, CKQ2. The reference symbol CKQ1 represents a first output clock signal, and the reference symbol CKQ2 represents a second output clock signal. The output clock signals CKQ1, CKQ2 are clock signals different in, for example, phase, and are specifically clock signals different in, for example, the phase as much as 180 degrees. As described above, the output buffer circuit 70 outputs the output clock signals CKQ1, CKQ2 based on the oscillation signal XI to the clock terminals TCK1, TCK2. Further, the output clock signals CKQ1, CKQ2 are output to the outside from the clock terminals TCK1, TCK2 via the external terminals of the oscillator 4. For example, the output buffer circuit 70 outputs the output clock signals CKQ1, CKQ2 in a single-ended CMOS signal format. For example, when an output enable signal input via an output enable terminal not shown is in an active state, the output buffer circuit 70 outputs the output clock signals CKQ1, CKQ2. In contrast, the output buffer circuit 70 sets the output clock signals CKQ1, CKQ2 to a stationary voltage level such as a low level when the output enable signal is in an inactive state. Thus, the voltage levels of the clock terminals TCK1, TCK2 are set to the stationary voltage level. It should be noted that it is possible to arrange that the output enable state is controlled individually for each of the output clock signals CKQ1, CKQ2. Further, when a signal is in the active state, for example, the signal is in the high level in the case of positive logic, and is in the low level in the case of negative logic. Further, when a signal is in the inactive state, for example, the signal is in the low level in the case of positive logic, and is in the high level in the case of negative logic. Further, in FIG. 2, the output buffer circuit 70 outputs the two output clock signals CKQ1, CKQ2, but it is possible to arrange that three or more output clock signals are output by buffering the clock signal CK. Further, it is possible to arrange that the output buffer circuit 70 outputs the output clock signals CKQ1, CKQ2 in a signal format other than the CMOS format.

Further, the output buffer circuit 70 includes the second duty adjustment circuit 80 for performing the duty adjustment of the output clock signal CKQ2 as the second output clock signal. For example, the output clock signal CKQ1 as the first output clock signal is output from the output buffer circuit 70 without the duty adjustment by the second duty adjustment circuit 80 performed thereon. In contrast, the output clock signal CKQ2 as the second output clock signal is output from the output buffer circuit 70 after the duty adjustment by the second duty adjustment circuit 80 is performed thereon. For example, the second duty adjustment circuit 80 performs the adjustment of the duty ratio of the output clock signal CKQ2 based on the adjustment data ADJ2 as second adjustment data.

Figure 2:
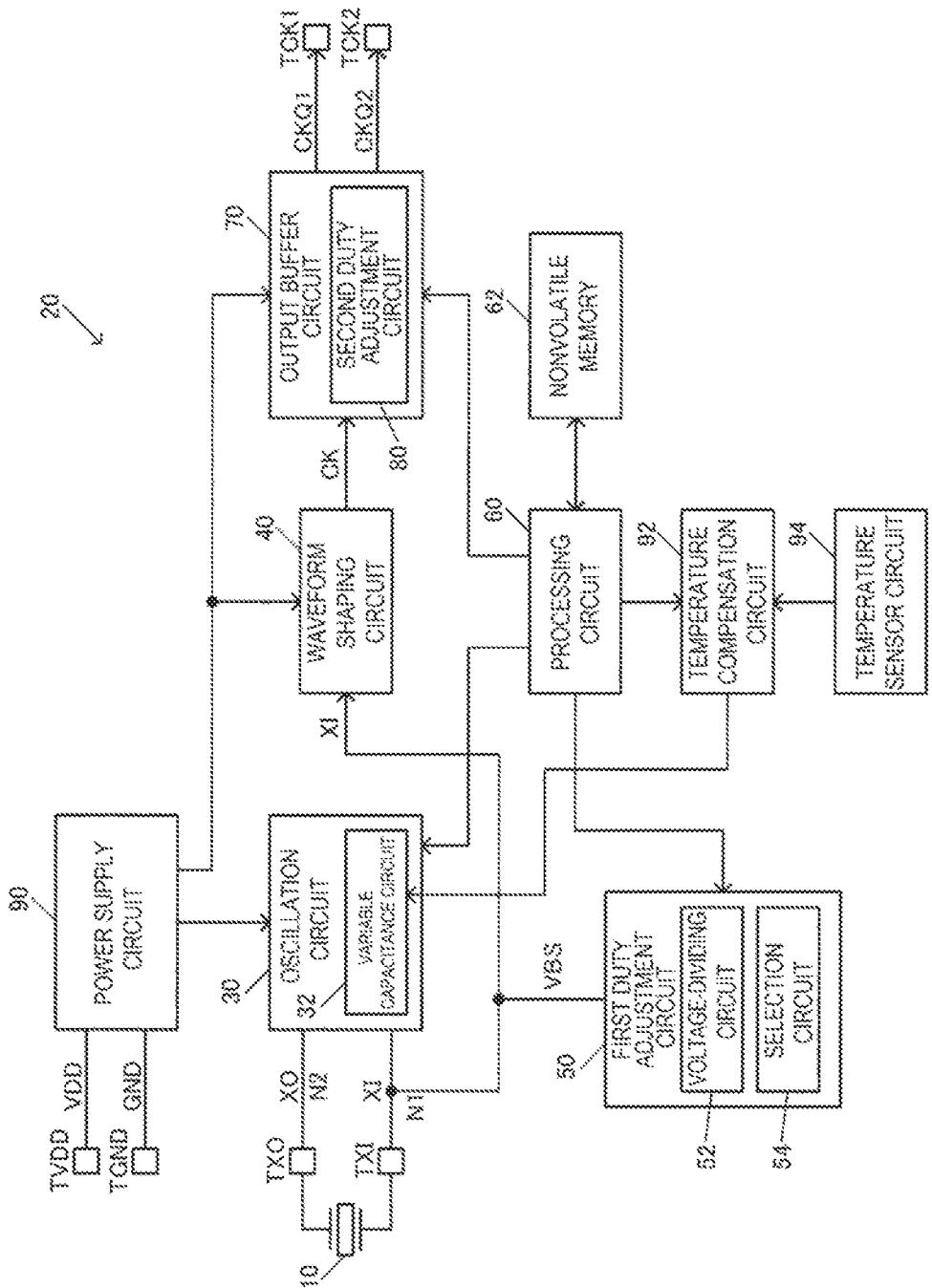
FIG. 2 is a diagram showing a detailed configuration example of the circuit device according to the embodiment.

FIG. 2 shows a detailed configuration example of the circuit device 20 according to the present embodiment. As shown in FIG. 2, the circuit device 20 can include a processing circuit 60, a nonvolatile memory 62, a power supply circuit 90, a temperature compensation circuit 92, a temperature sensor circuit 94 in addition to the configuration shown in FIG. 1.

The processing circuit 60 is a control circuit for performing a variety of types of control processing, and is realized by, for example, a logic circuit. For example, the processing circuit 60 performs overall control of the circuit device 20, and performs control of an operation sequence of the circuit device 20. Further, the processing circuit 60 performs control of circuit blocks of the circuit device 20 such as the oscillation circuit 30, the output buffer circuit 70, and the temperature compensation circuit 92. Further, the processing circuit 60 performs reading control and writing control of the nonvolatile memory 62. The processing circuit can be realized by a circuit of an ASIC (Application Specific Integrated Circuit) with automatic arrangement wiring such as a gate array.

The nonvolatile memory 62 stores a variety of types of information used in the circuit device 20. The nonvolatile memory 62 can be realized by an EEPROM such as a FAMOS (Floating gate Avalanche injection MOS) memory or a MONOS (Metal-Oxide-Nitride-Oxide-Silicon) memory, but is not limited thereto, and can be an OTP (One Time Programmable) memory, a fuse-type ROM, or the like.

The nonvolatile memory 62 stores the adjustment data ADJ, ADJ2 shown in FIG. 1. Further, the adjustment data ADJ having been retrieved from the nonvolatile memory 62 via the processing circuit 60 is input to the first duty adjustment circuit 50, and the first duty adjustment circuit 50 performs the duty adjustment of the clock signal CK based on the adjustment data ADJ. For example, the first duty adjustment circuit 50 supplies the first node N1 with the bias voltage VBS which is variably adjusted in accordance with the adjustment data ADJ to thereby perform the duty adjustment of the clock signal CK. Further, the duty adjustment of the output clock signal CKQ2 is performed by the second duty adjustment circuit 80 based on the adjustment data ADJ2 retrieved from the nonvolatile memory 62 via the processing circuit 60. The second duty adjustment circuit 80 performs the duty adjustment of the output clock signal CKQ2 using, for example, the control signal based on the adjustment data ADJ2. As described above, the circuit device 20 according to the present embodiment includes the nonvolatile memory 62 for storing the adjustment data ADJ, ADJ2. Further, the first duty adjustment circuit 50 performs the duty adjustment of the clock signal CK based on the adjustment data ADJ stored in the nonvolatile memory 62. For example, the first duty adjustment circuit 50 performs the duty adjustment of the output clock signal CKQ1. Further, the second duty adjustment circuit 80 performs the duty adjustment of the output clock signal CKQ2 based on the adjustment data ADJ2 stored in the nonvolatile memory 62. It should be noted that the nonvolatile memory 62 also stores information for temperature compensation as described later.

The power supply circuit 90 is supplied with a power supply voltage VDD from a power supply terminal TVDD, and is supplied with a ground voltage GND from a ground terminal GND, and thus, supplies the circuit blocks of the circuit device 20 with the power supply voltages for the individual circuit blocks. For example, the power supply circuit 90 has a regulator, and the regulator supplies regulated power supply voltages generated based on the power supply voltage VDD to the individual circuit blocks of the circuit device 20. For example, the power supply circuit 90 supplies the oscillation circuit 30 with a first regulated power supply voltage, and supplies the waveform shaping circuit 40 and the output buffer circuit 70 with a second regulated power supply voltage different from the first regulated power supply voltage. Further, the power supply circuit 90 also supplies a variety of regulated power supply voltages to the first duty adjustment circuit 50, the processing circuit 60, the nonvolatile memory 62, the temperature compensation circuit 92, and the temperature sensor circuit 94. Further, the power supply circuit 90 also has a reference voltage generation circuit and a reference current generation circuit.

The temperature compensation circuit 92 performs the temperature compensation of the oscillation frequency of the oscillation circuit 30. The temperature compensation of the oscillation frequency corresponds to the temperature compensation of the oscillation signals XI, XO of the oscillation circuit 30. Specifically, the temperature compensation circuit 92 performs the temperature compensation based on temperature detection information from the temperature sensor circuit 94. For example, the temperature compensation circuit 92 generates the temperature compensation voltage based on the temperature detection voltage from the temperature sensor circuit 94, and then outputs the temperature compensation voltage thus generated to the oscillation circuit 30 to thereby perform the temperature compensation of the oscillation frequency of the oscillation circuit 30. For example, the temperature compensation circuit outputs the temperature compensation voltage to be a capacitance control voltage of the variable capacitance circuit 32 to a variable capacitance circuit 32 provided to the oscillation circuit 30 to adjust the capacitance of the variable capacitance circuit 32 to thereby perform the temperature compensation. In this case, the variable capacitance circuit 32 of the oscillation circuit 30 is realized by a variable capacitance element such as a varactor. The temperature compensation is processing of suppressing the fluctuation of the oscillation frequency due to the temperature fluctuation to thereby compensate the oscillation frequency. For example, the temperature compensation circuit 92 performs analog temperature compensation due to polynomial approximation. For example, when the temperature compensation voltage for compensating the frequency-temperature characteristic of the resonator 10 is approximated by a polynomial, the temperature compensation circuit 92 performs the analog temperature compensation based on coefficient information of the polynomial. The analog temperature compensation is the temperature compensation realized by, for example, an add processing of a current signal or a voltage signal as an analog signal. Specifically, the nonvolatile memory 62 stores the coefficient information of the polynomial for the temperature compensation, and the processing circuit 60 retrieves the coefficient information from the nonvolatile memory 62, and then sets the coefficient information to, for example, a register of the temperature compensation circuit 92. Then, the temperature compensation circuit 92 performs the analog temperature compensation based on the coefficient information set to the register. It should be noted that it is also possible to arrange that the temperature compensation circuit 92 performs digital temperature compensation. In this case, the temperature compensation circuit 92 performs a digital temperature compensation process based on temperature detection data as the temperature detection information of the temperature sensor circuit 94. For example, the temperature compensation circuit 92 obtains frequency adjustment data based on the temperature detection data.

Further, by the capacitance of the variable capacitance circuit 32 of the oscillation circuit 30 being adjusted based on the frequency adjustment data thus obtained, the temperature compensation process of the oscillation frequency of the oscillation circuit 30 is realized. In this case, the variable capacitance circuit of the oscillation circuit 30 is realized by the capacitor array having a plurality of binary-weighted capacitors, and the switch array. Further, the nonvolatile memory 62 stores a look-up table representing a correspondence between the temperature detection data and the frequency adjustment data, and the temperature compensation circuit 92 performs the temperature compensation process for obtaining the frequency adjustment data from the temperature detection data using the look-up table retrieved from the nonvolatile memory 62 by the processing circuit 60.

The temperature sensor circuit 94 is a sensor circuit for detecting the temperature. Specifically, the temperature sensor circuit 94 outputs a temperature-dependent voltage which varies in accordance with the environmental temperature as a temperature detection voltage. For example, the temperature sensor circuit 94 generates the temperature detection voltage using a circuit element having the temperature dependency. Specifically, the temperature sensor circuit 94 uses the temperature dependency provided to the forward voltage of a PN junction to thereby output the temperature detection voltage having a voltage value changing dependently on the temperature. As the forward voltage of the PN junction, there can be used, for example, a base-emitter voltage of a bipolar transistor. It should be noted that when performing the digital temperature compensation process, the temperature sensor circuit 94 measures the temperature such as the environmental temperature, and then outputs the result as the temperature detection data. The temperature detection data is, for example, data monotonically increasing or monotonically decreasing with respect to the temperature.

Further, the first duty adjustment circuit 50 includes a voltage-dividing circuit 52 and a selection circuit 54. The voltage-dividing circuit 52 performs voltage division of the power supply voltage and the ground voltage to thereby output a plurality of divisional voltages. For example, the voltage-dividing circuit 52 has a plurality of resistors coupled in series between a power supply node and a ground node, and outputs the plurality of divisional voltages divided in voltage by the plurality of resistors. In other words, the voltage-dividing circuit 52 is realized by a resistor ladder circuit or the like. The power supply node is a node supplied with the power supply voltage, and the ground node is a node supplied with the ground voltage. Further, the selection circuit 54 selects a first divisional voltage which is one of the divisional voltages as the bias voltage VBS. In other words, the selection circuit 54 selects the first divisional voltage out of the divisional voltages as the bias voltage VBS based on the adjustment data ADJ. Further, the selection circuit 54 selects a second divisional voltage which is one of the divisional voltages as a reference voltage VREF described later.

2. First Duty Adjustment Circuit

Figure 3:
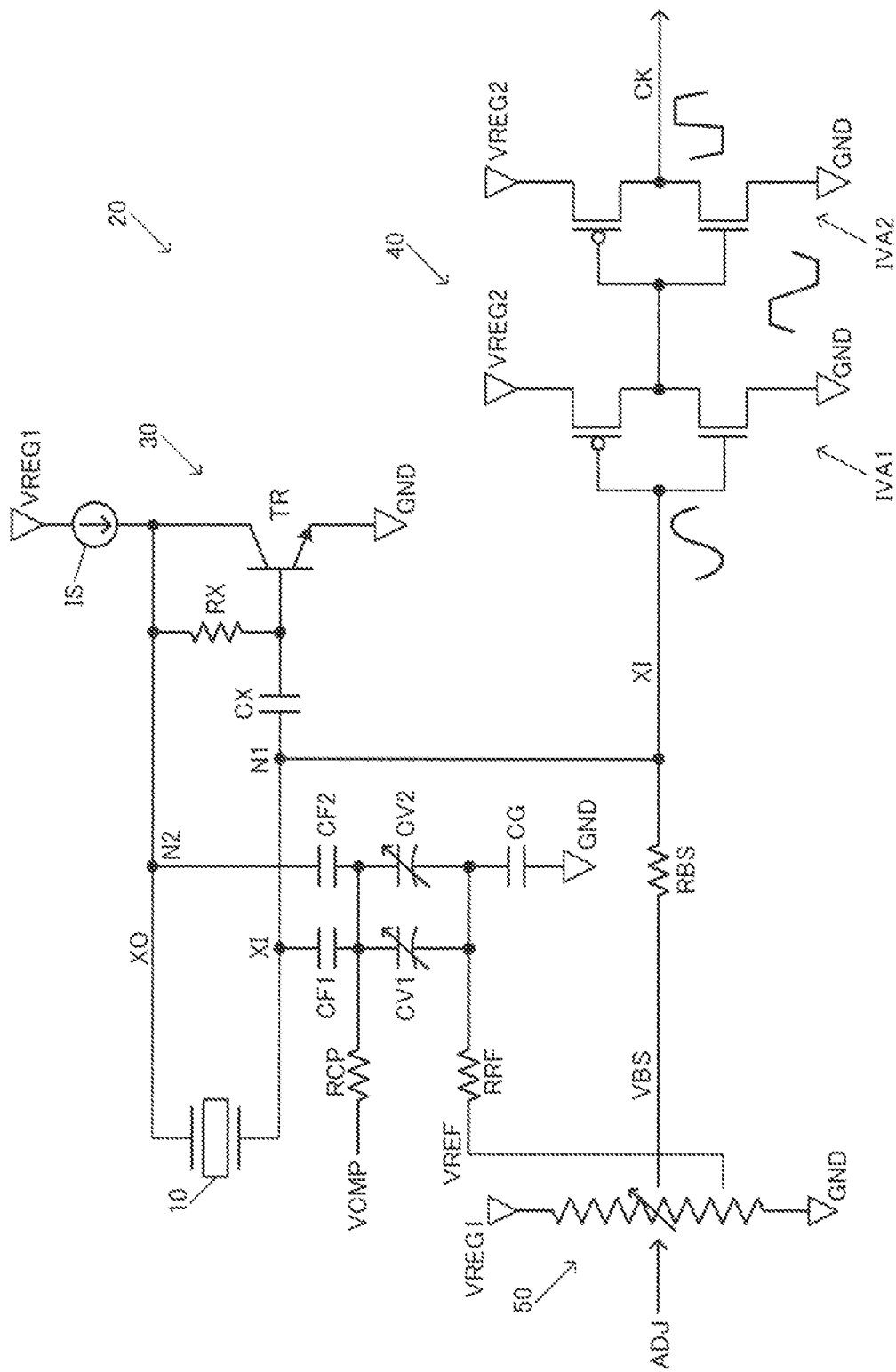
FIG. 3 is a diagram showing a configuration example of the circuit device for explaining the detail of a first duty adjustment circuit.

Then, the details of the first duty adjustment circuit 50 will be described. FIG. 3 shows a configuration example of the circuit device 20 for explaining the detail of the first duty adjustment circuit 50. In FIG. 3, the oscillation circuit 30 includes a current source IS, a bipolar transistor TR, a resistor RX, and a capacitor CX. The current source IS and the bipolar transistor TR are disposed in series between a power supply node at VREG1 and the ground node. The current source IS and the bipolar transistor TR constitute the drive circuit of the oscillation circuit 30. The current source IS can be realized by, for example, a CMOS transistor the gate of which is provided with the bias voltage. The resistor RX is disposed between a collector node and a base node of the bipolar transistor TR. The capacitor CX is disposed between the base node of the bipolar transistor TR and the first node N1.

Further, in FIG. 3, as the variable capacitance circuit 32 shown in FIG. 2, the oscillation circuit 30 includes variable capacitance elements CV1, CV2 realized by varactors or the like, and capacitors CF1, CF2 each having a stationary capacitance in which the capacitance values are fixed. Specifically, the oscillation circuit 30 includes the capacitor CF1 having a stationary capacitance and having one end to be coupled to the first node N1, and the variable capacitance element CV1 one end of which is coupled to the other end of the capacitor CF1 having the stationary capacitance, and which is variable in capacitance value. Further, the oscillation circuit 30 includes the capacitor CF2 having a stationary capacitance and having one end to be coupled to the second node N2, and the variable capacitance element CV2 one end of which is coupled to the other end of the capacitor CF2 having the stationary capacitance, and which is variable in capacitance value. Between the other ends of the variable capacitance elements CV1, CV2 and the ground node, there is disposed a capacitor CG. Further, a temperature compensation voltage VCMP from the temperature compensation circuit 92 shown in FIG. 2 is supplied to the one ends of the variable capacitance elements CV1, CV2 via a resistor RCP. Further, a reference voltage VREF is supplied to the other ends of the variable capacitance elements CV1, CV2 via a resistor RRF. In this way, a voltage corresponding to a voltage difference between the temperature compensation voltage VCMP and the reference voltage VREF is applied to the variable capacitance elements CV1, CV2. Thus, the variable capacitance elements CV1, CV2 are set to a capacitance corresponding to the temperature compensation voltage VCMP, and the temperature compensation of the oscillation frequency of the oscillation circuit 30 is realized. It should be noted that in FIG. 3, the first duty adjustment circuit 50 for supplying the bias voltage VBS also supplies the reference voltage VREF.

The first duty adjustment circuit 50 is realized by a ladder resistance circuit disposed between the power supply node of the power supply voltage VREG1 and the ground node, and outputs the bias voltage VBS as the divisional voltage by the ladder resistance circuit. Further, the first duty adjustment circuit 50 outputs the reference voltage VREF for the temperature compensation as described above. Further, the bias voltage VBS is supplied to the first node N1 via a resistor RBS. By the bias voltage VBS, a central voltage of the oscillation signal XI as the AC signal is set, and the oscillation signal XI as, for example, a sine wave which varies centering around the bias voltage VBS becomes to be input to the waveform shaping circuit 40.

The waveform shaping circuit 40 includes a plurality of inverter circuits IVA1, IVA2 which forms a buffer circuit. The inverter circuits IVA1, IVA2 are each constituted by a P-type transistor and an N-type transistor disposed in series between a power supply node of the power supply voltage VREG2 and the ground node. Further, the oscillation signal XI the bias point of which is set by the bias voltage VBS is input to the inverter circuit IVA1 which is a first stage inverter circuit of the waveform shaping circuit 40 as an input signal. In other words, the oscillation signal XI is input to the respective gates of the P-type transistor and the N-type transistor constituting the inverter circuit IVA1. Further, an output signal of the inverter circuit IVA1 is input to the inverter circuit IVA2 which is a next stage inverter circuit, and the inverter circuit IVA2 outputs the clock signal CK. Thus, the clock signal CK as a rectangular wave obtained by performing waveform shaping on the oscillation signal XI becomes to be output from the waveform shaping circuit 40.

It should be noted that as an example, the temperature compensation voltage VCMP is a voltage which varies centering around the voltage of, for example, 0.9 V in accordance with the temperature detection result. The reference voltage VREF is a voltage of, for example, around 0.3 V through 0.4 V. The power supply voltage VREG1 is, for example, 1.2 V, and the power supply voltage VREG2 is, for example, 1.0 V. The bias voltage VBS is a voltage which is adjusted in a range of, for example, ±0.1 V centering on 0.5 V as a voltage about a half of the power supply voltage VREG2 of, for example, the waveform shaping circuit 40.

As described above, the circuit device 20 according to the present embodiment includes the oscillation circuit 30, the waveform shaping circuit 40, and the first duty adjustment circuit 50, wherein the oscillation circuit 30 is coupled to the first node N1 and the second node N2 both coupled to the resonator 10, and generates the oscillation signals XI, XO, the oscillation signal XI is input to the waveform shaping circuit 40 from the first node N1, the waveform shaping circuit 40 outputs the clock signal CK, and the first duty adjustment circuit 50 supplies the first node N1 with the bias voltage VBS which is variably adjusted based on the adjustment data ADJ. Further, by the oscillation signal X1 which varies centering on the bias voltage VBS variably adjusted by the adjustment data ADJ being input to the waveform shaping circuit 40 to be shaped in waveform, the duty ratio of the clock signal CK becomes to be adjusted.

In this way, it becomes possible to adjust the duty ratio of the clock signal CK taking the process fluctuation of the threshold voltages or the like of the P-type transistor and the N-type transistor constituting the waveform shaping circuit 40, a degree of the distortion of the oscillation waveform, and a shift of the duty ratio in the posterior stage circuit into consideration, and it becomes possible to adjust the duty ratios of the output clock signals CKQ1, CKQ2 from the circuit device 20. Thus, it becomes possible to approximate the duty ratio to, for example, 50%, and it becomes possible to realize the high-accuracy duty adjustment.

Figure 4:
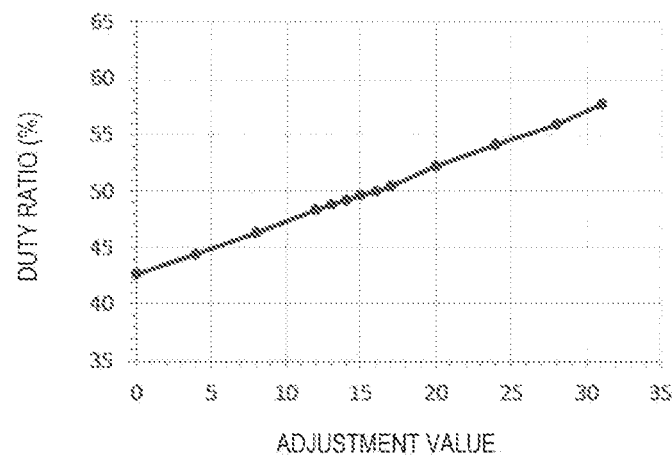
FIG. 4 is a graph showing a relationship between an adjustment value of adjustment data and a duty ratio.

For example, FIG. 4 is a graph showing a relationship between the adjustment value of the adjustment data ADJ and the duty ratio. In FIG. 4, there is performed the duty adjustment in which 50%±8% is sliced into, for example, 32 steps with the adjustment data ADJ in, for example, 5 bits, and there is performed the duty adjustment with the resolution of 0.4%.

Figure 5:
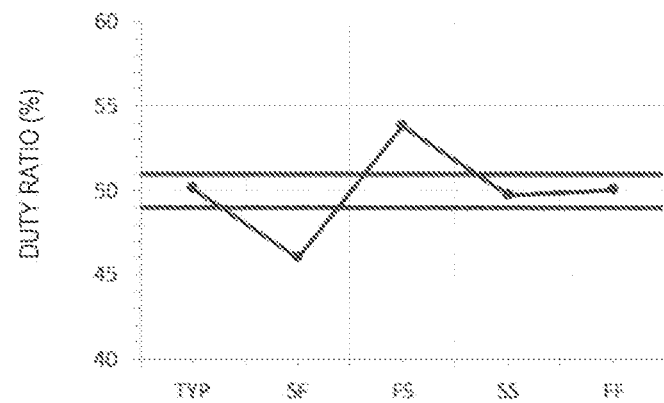
FIG. 5 is a graph showing a process fluctuation of a duty ratio of a clock signal.

FIG. 5 is a graph showing a corner simulation result of the process fluctuation of the duty ratio when the duty adjustment by the first duty adjustment circuit 50 has not been performed. Here, TYP means a typical case. SF means a case in which the N-type transistor is Slow, and the P-type transistor is Fast, and FS means a case in which the N-type transistor is Fast, and the P-type transistor is Slow. SS means a case in which the N-type transistor and the P-type transistor are both Slow, and FF means a case in which the N-type transistor and the P-type transistor are both Fast. As shown in FIG. 5, due to the fluctuation of the manufacturing process of the semiconductor, the duty ratio fluctuates in a range of about 50%+5%.

Figure 6:
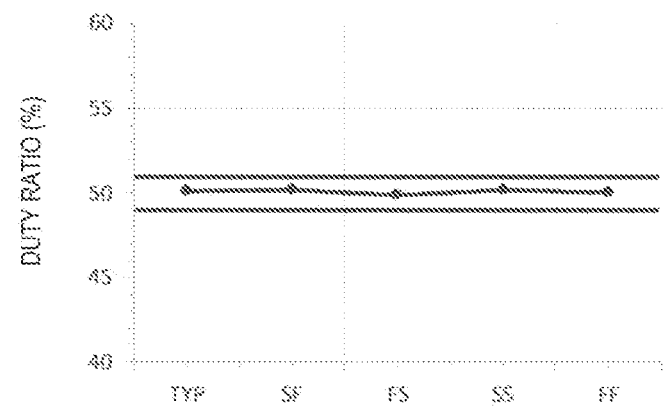
FIG. 6 is a graph showing a process fluctuation of a duty ratio when performing a duty adjustment of the first duty adjustment circuit.

In contrast, FIG. 6 is a graph showing a corner simulation result of the process fluctuation of the duty ratio when the duty adjustment by the first duty adjustment circuit 50 has been performed. As shown in FIG. 6, by the first duty adjustment circuit 50 supplying the bias voltage VBS variably set based on the adjustment data ADJ, it becomes possible to realize such a high-accuracy duty adjustment as to make, for example, the fluctuation of the duty ratio become within a range of 50%+1%.

Figure 7:
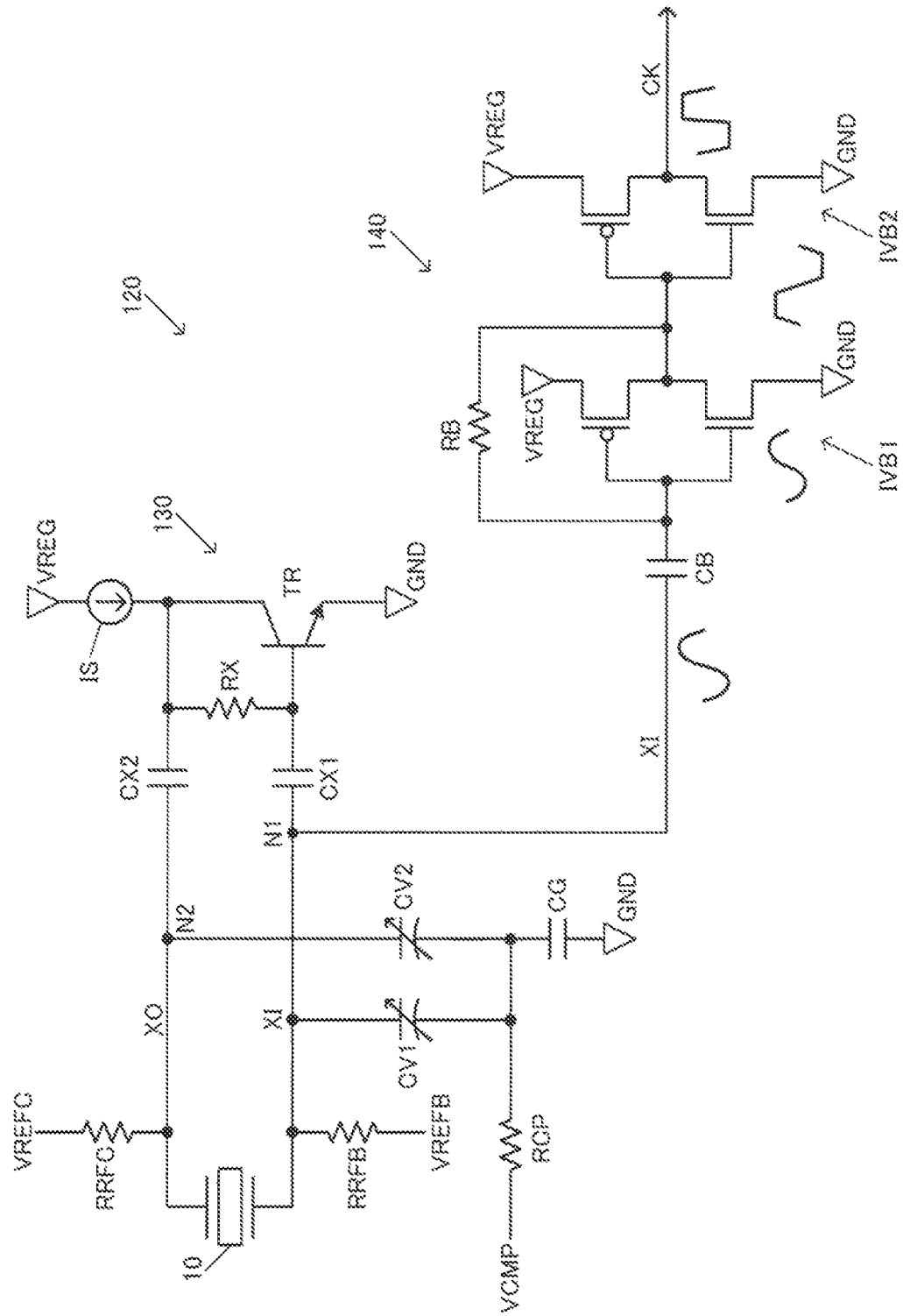
FIG. 7 is a diagram showing a configuration example of a circuit device according to a first comparative example of the present embodiment.

FIG. 7 shows a circuit device 120 according to a first comparative example of the present embodiment. In an oscillation circuit 130 of the circuit device 120 according to the first comparative example, there is disposed a capacitor CX2 between the second node N2 and a collector node of the bipolar transistor TR in addition to a capacitor CX1 between the first node N1 and a base node of the bipolar transistor TR. Further, the variable capacitance element CV1 is coupled to the first node N1 in one end, and is coupled to a supply node of the temperature compensation voltage VCMP in the other end, and the variable capacitance element CV2 is coupled to the second node N2 in one end, and is coupled to the supply node of the temperature compensation voltage VCMP in the other end. Further, a reference voltage VREFB is supplied to the first node N1 as the node of the oscillation signal XI, and a reference voltage VREFC is supplied to the second node N2 as the node of the oscillation signal XO. Thus, the oscillation signal XI becomes an oscillation signal which varies centering on the reference voltage VREFB, and the oscillation signal XO becomes an oscillation signal which varies centering on the reference voltage VREFC. The reference voltage VREFB is, for example, 0.4 V, and the reference voltage VREFC is, for example, 1.2 V.

Further, in the first comparative example shown in FIG. 7, a capacitor CB for cutting the DC component is disposed between the first node N1 and an input node of a waveform shaping circuit 140. Thus, the DC component of the oscillation signal XI is cut, and the AC component becomes to be input to the waveform shaping circuit 140. Further, the waveform shaping circuit 140 includes inverter circuits IVB1, IVB2, and the inverter circuit IVB1 as the first stage inverter circuit is provided with a feedback resistor RB disposed between an output node and an input node thereof. By disposing such a feedback resistor RB, the bias point of the inverter circuit IVB1 as the first stage inverter circuit becomes to be set by the self-bias.

As described above, in the first comparative example shown in FIG. 7, the reference voltage VREFB for the temperature compensation is applied to the first node N1 as the node of the oscillation signal XI, and the oscillation signal XI becomes the oscillation signal which varies centering on the reference voltage VREFB. Here, the reference voltage VREFB is adjusted to, for example, a voltage which optimizes the sensitivity of the variable capacitance element CV1, but does not coincide with the threshold voltage of the inverter circuit IVB1 as the first stage inverter circuit of the waveform shaping circuit 140. As an example, in the first comparative example, since the inverter circuit IVB1 is supplied with the power supply voltage of VREG=1.5 V, the threshold voltage of the inverter circuit IVB1 becomes about VREG/2=0.75 V. In contrast, since the reference voltage VREFB is adjusted to, for example, VREFB=0.4 V so that the sensitivity of the variable capacitance element CV1 is optimized, the threshold voltage of the inverter circuit IVB1 and the reference voltage VREFB to be the central voltage of the oscillation signal XI do not coincide with each other. Further, the reference voltage VREFB is adjusted in accordance with the manufacturing fluctuation of the varactor as the variable capacitance element and so on, but is not adjusted in accordance with the manufacturing fluctuation of the P-type transistor and the N-type transistor constituting the inverter circuit IVB1 and so on.

Therefore, in the first comparative example shown in FIG. 7, it is necessary to dispose the capacitor CB for cutting the DC component to the input node of the inverter circuit IVB1 to cut the DC component of the oscillation signal XI, and thus, input only the AC component of the oscillation signal XI to the inverter circuit IVB1. Further, in the inverter circuit IVB1 as the first stage inverter circuit, by coupling the output node and the input node to each other via the feedback resistor RB, the bias point is adjusted by the self-bias. However, in such an adjustment of the bias point with the self-bias, there is a problem that when a nonlinear distortion occurs in the waveform of the oscillation signal XI, the duty ratio of the clock signal CK fluctuates, and thus, it is unachievable to realize the high-accuracy duty ratio. For example, in the comparative example shown in FIG. 7, an effective value of the fluctuation of the duty ratio is about %+4%, and it is unachievable to realize such a high-accuracy duty ratio as within 50%+1% There is an application in which when an external processing device performs processing based on, for example, the output clock signals CKQ1, CKQ2 obtained by buffering the clock signal CK, the processing device performs the processing using not only the rising edges of the output clock signals CKQ1, CKQ2 but also the falling edges thereof. In such an application, since it is unachievable to perform appropriate processing with the duty ratio of about 50%±4%, such a high-accuracy duty ratio as within 50%±1% is required in some cases, but it is unachievable to meet such needs in the first comparative example shown in FIG. 7.

In this regard, in the circuit device 20 according to the present embodiment shown in FIG. 3, the capacitor CF1 for cutting the DC component is disposed between the first node N1 of the oscillation signal XI and the variable capacitance element CV1. Further, the capacitor CF2 for cutting the DC component is also disposed between the second node N2 of the oscillation signal XO and the variable capacitance element CV2. In this way, it becomes possible to set the bias voltage VBS independent of the setting of the reference voltage VREF for the temperature compensation, and it becomes possible to make the oscillation signal XI turn to an oscillation signal which varies centering on the bias voltage VBS.

For example, by adjusting the reference voltage VREF, it is possible to adjust the variable capacitance elements CV1, CV2 so as to have optimum sensitivity. In this case, the capacitance of the first node N1 becomes a series capacitance of the variable capacitance element CV1 and the capacitor CF1, and the capacitance of the second node N2 becomes a series capacitance of the variable capacitance element CV2 and the capacitor CF2. However, by making the capacitances of the capacitors CF1, CF2 sufficiently high, it becomes possible to adjust the capacitances of the first node N1 and the second node N2 to appropriate capacitances corresponding to the environmental temperature, using the variable capacitance elements CV1, CV2.

Further, in the present embodiment, it is possible to adjust the bias voltage VBS to an appropriate voltage with which the duty ratio of the clock signal CK comes closer to % with the first duty adjustment circuit 50 using the adjustment data ADJ independently of the reference voltage VREF.

It is assumed that, for example, the threshold voltage of the inverter circuit IVA1 as the first stage inverter circuit of the waveform shaping circuit 40 shown in FIG. 3 becomes a voltage lower than the voltage a half of the power supply voltage VREG2 due to the process fluctuation of the threshold voltage and so on of the P-type transistor and the N-type transistor. When there occurs the process fluctuation in which, for example, the N-type transistor is Fast, and the P-type transistor becomes Slow, the threshold voltage of the inverter circuit IVA1 becomes the voltage lower than the voltage a half of the power supply voltage VREG2. On this occasion, when the bias voltage VBS is kept at the voltage a half of the power supply voltage VREG2, there occurs the situation in which the duty ratio of the clock signal CK becomes higher than 50% In this case, in the present embodiment, the first duty adjustment circuit 50 sets the bias voltage VBS to a voltage lower than the voltage a half of the power supply voltage VREG2 based on the adjustment data ADJ. In this way, even when the threshold voltage of the inverter circuit IVA1 becomes the lower voltage due to the process fluctuation, the bias voltage VBS to be the central voltage of the oscillation signal XI lowers accordingly, and therefore, it becomes possible to make the duty ratio of the clock signal CK closer to 50%. Therefore, it is possible to realize such a high-accuracy duty adjustment that the fluctuation of the duty ratio becomes within 50%+1%.

In contrast, it is assumed that the threshold voltage of the inverter circuit IVA1 as the first stage inverter circuit of the waveform shaping circuit 40 becomes a voltage higher than the voltage a half of the power supply voltage VREG2 due to the process fluctuation of the threshold voltage and so on of the P-type transistor and the N-type transistor. When there occurs the process fluctuation in which, for example, the P-type transistor is Fast, and the N-type transistor becomes Slow, the threshold voltage of the inverter circuit IVA1 becomes the voltage higher than the voltage a half of the power supply voltage VREG2.

On this occasion, when the bias voltage VBS is kept at the voltage a half of the power supply voltage VREG2, there occurs the situation in which the duty ratio of the clock signal CK becomes lower than 50% In this case, in the present embodiment, the first duty adjustment circuit 50 sets the bias voltage VBS to a voltage higher than the voltage a half of the power supply voltage VREG2 based on the adjustment data ADJ. In this way, even when the threshold voltage of the inverter circuit IVA1 becomes the higher voltage due to the process fluctuation, the bias voltage VBS to be the central voltage of the oscillation signal XI becomes higher accordingly, and therefore, it becomes possible to make the duty ratio of the clock signal CK closer to 50%. Therefore, it is possible to realize such a high-accuracy duty adjustment that the fluctuation of the duty ratio becomes within 50%±1%.

Further, in FIG. 3, since there is no need to provide the capacitor CB for cutting the DC component disposed in the first comparative example shown in FIG. 7, attenuation of the oscillation amplitude due to the voltage division by the capacitor CB for cutting the DC component and the input capacitance is suppressed, and therefore, it becomes possible to realize a decrease in noise floor. Further, since such a feedback resistor RB as shown in FIG. 7 becomes unnecessary, it becomes possible to prevent an abnormal oscillation caused by the feedback resistor RB.

Figure 8:
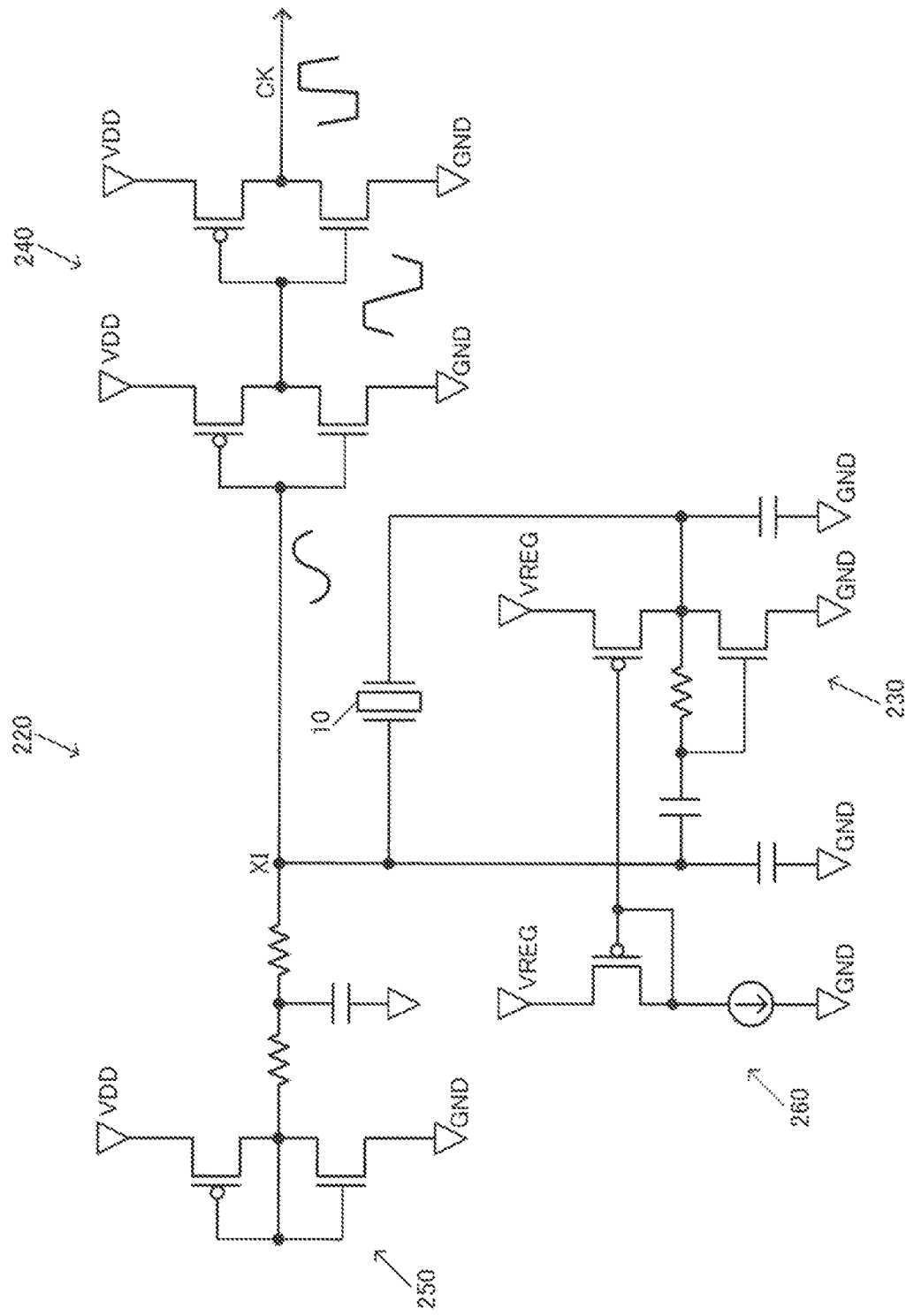
FIG. 8 is a diagram showing a configuration example of a circuit device according to a second comparative example of the present embodiment.

FIG. 8 shows a circuit device 220 according to a second comparative example of the present embodiment. The circuit device 220 according to the second comparative example is provided with an oscillation circuit 230, a waveform shaping circuit 240, a bias circuit 250, and a constant current circuit 260. In this second comparative example, the bias circuit 250 is a replica circuit of the waveform shaping circuit 240, and the bias voltage output by the bias circuit 250 depends on the power supply voltage VDD supplied. For example, the bias circuit 250 outputs a bias voltage about a half of the power supply voltage VDD. However, the duty ratio of the clock signal CK also fluctuates due to a circuit in the posterior stage, and also fluctuates due to the distortion of the oscillation waveform in addition to the fluctuation due to the variation in a range of, for example, about ±0.1 V of the threshold voltage of the P-type transistor and the N-type transistor in the first stage inverter circuit. Therefore, in the second comparative example shown in FIG. 8, there is a problem that it is unachievable to realize the high-accuracy duty adjustment taking such a variety of fluctuation factors into consideration. Further, in the second comparative example shown in FIG. 8, the bias circuit 250 simply outputs the bias voltage about a half of the power supply voltage VDD, and an adjustment circuit for adjusting the bias voltage based on the adjustment data does not exist.

In this regard, in the circuit device 20 according to the present embodiment, it is possible to variably adjust the bias voltage VBS based on the adjustment data ADJ. In other words, there is provided the first duty adjustment circuit 50 as the circuit for adjusting the bias voltage VBS based on the adjustment data ADJ. Therefore, since it is possible to adjust the bias voltage VBS to adjust the duty ratio of the clock signal CK taking the shift of the duty ratio in the circuit in the posterior stage, the degree of the distortion of the oscillation waveform, and so on into consideration in addition to, for example, the variation in the threshold voltage and so on of the P-type transistor and the N-type transistor in the inverter circuit IVA1 as the first stage inverter circuit shown in FIG. 3, it becomes possible to achieve the high-accuracy duty adjustment compared to the second comparative example shown in FIG. 8 and so on.

For example, the circuit device 20 according to the present embodiment includes the nonvolatile memory 62 for storing the adjustment data ADJ, and the first duty adjustment circuit 50 generates the bias voltage VBS as the voltage set in accordance with the adjustment data ADJ stored in the nonvolatile memory 62. For example, the first duty adjustment circuit 50 generates the bias voltage VBS having the first voltage value corresponding to the first adjustment value when the adjustment data ADJ stored in the nonvolatile memory 62 represents the first adjustment value, and generates the bias voltage VBS having the second voltage value corresponding to the second adjustment value when the adjustment data ADJ represents the second adjustment value. In this way, by storing the adjustment data ADJ making it possible to set the optimum duty ratio in the nonvolatile memory 62, and when the circuit device 20 operates, by the first duty adjustment circuit 50 then supplying the bias voltage VBS corresponding to the adjustment data ADJ retrieved from the nonvolatile memory 62, it becomes possible to realize such a high-accuracy duty adjustment as 50%±1%. Specifically, in an inspection step in manufacturing the circuit device 20 and so on, the duty ratio of the output clock signal CKQ1 and so on is measured, the adjustment data ADJ is decided based on the measurement result, and is then written into the nonvolatile memory 62. For example, the adjustment data ADJ is decided taking not only the variation in the threshold voltage and so on of the transistor due to the process fluctuation, but also the nonlinear distortion of the oscillation waveform and so on into consideration. Further, when the circuit device 20 operates, the adjustment data ADJ thus decided based on the measurement result is retrieved from the nonvolatile memory 62, and then the first duty adjustment circuit 50 supplies the bias voltage VBS corresponding to the adjustment data ADJ, and thus, it becomes possible to realize such a high-accuracy duty adjustment as within 50%±1%.

Further, in the present embodiment, the power supply voltage VREG1 of the oscillation circuit 30 shown in FIG. 3 is set no lower than the power supply voltage VREG2 of the waveform shaping circuit 40. In other words, a relationship of VREG1≥VREG2 is fulfilled. As an example, the power supply voltage VREG1 is 1.2 V, and the power supply voltage VREG2 is 1 V.

In contrast, in the second comparative example shown in FIG. 8, the power supply voltage VREG of the oscillation circuit 230 is 1.2 V, the power supply voltage VDD of the waveform shaping circuit 240 and the bias circuit 250 is in a range of 1.8 through 5 V, and a relationship of VREG<VDD is fulfilled. Therefore, the amplitude voltage of the oscillation signal XI input to the waveform shaping circuit 240 is lower than the power supply voltage VDD of the waveform shaping circuit 240, and a rising waveform and a falling waveform of an output signal of the first stage inverter circuit of the waveform shaping circuit 240 fail to be steep, but becomes an obtuse waveform. Further, when the output signal of the first stage inverter circuit becomes the obtuse waveform, the duty ratio fluctuates due to a variation in the threshold voltage and so on of the P-type transistor and the N-type transistor of the next stage inverter circuit.

In contrast, in the present embodiment, the power supply voltage VREG1 of the oscillation circuit 30 is set no lower than the power supply voltage VREG2 of the waveform shaping circuit 40. Therefore, it becomes possible to make the amplitude of the oscillation signal XI to be input to the waveform shaping circuit 40 as large as possible within a drive voltage range of the waveform shaping circuit 40. In other words, it becomes possible to input the oscillation signal XI having the largest possible amplitude within the drive voltage range of the waveform shaping circuit 40 decided by the power supply voltage VREG2 to the inverter circuit IVA1 as the first stage inverter circuit of the waveform shaping circuit 40. Therefore, since the period in which both of the P-type transistor and the N-type transistor of the inverter circuit IVA1 as the first stage inverter circuit is set to an ON state almost vanishes, the rising waveform and the falling waveform of the output signal of the inverter circuit IVA1 become steep. As a result, it becomes possible to decrease the fluctuation of the duty ratio caused by the variation in the threshold voltage and so on of the P-type transistor and the N-type transistor of the inverter circuit IVA2 as the next stage inverter circuit. Further, an AM noise caused by the fluctuation of the amplitude of the oscillation signal XI is converted into a PM noise as a phase noise due to the waveform shaping by the waveform shaping circuit 40. In this regard, by making the relationship of VREG1≥VREG2 be fulfilled, and making the amplitude of the oscillation signal XI as large as possible within the drive voltage range of the waveform shaping circuit 40 as in the present embodiment, it is possible to decrease the degree of the conversion of the AM noise into the PM noise to improve the signal quality of the clock signal CK. Further, the waveform shaping circuit 40 and the output buffer circuit 70 in the posterior stage operate with the same power supply voltage VREG2, and by making the power supply voltage VREG2 lower than the power supply voltage VREG1 of the oscillation circuit 30, it is possible to reduce the power consumption in the output buffer circuit 70. For example, the output buffer circuit 70 drives a heavy load in the outside, and is therefore higher in power consumption compared to other circuit blocks, but by setting the power supply voltage VREG2 to a voltage lower than the power supply voltage VREG1, it becomes possible to reduce the power consumption accordingly.

Further, as shown in FIG. 3, in the present embodiment, the oscillation circuit 30 includes the capacitor CF1 having a stationary capacitance the capacitance value of which is fixed, and coupled to the first node N1 in one end, and the variable capacitance element CV1 one end of which is coupled to the other end of the capacitor CF1 having the stationary capacitance, and which is variable in capacitance value. Further, the temperature compensation voltage VCMP is input to one of the one end and the other end of the variable capacitance element CV1, and the reference voltage VREF is input to the other of the one end and the other end thereof. For example, in FIG. 3, the temperature compensation voltage VCMP is input to the one end of the variable capacitance element CV1, and the reference voltage VREF is input to the other end of the variable capacitance element CV1. It should be noted that it is possible to input the temperature compensation voltage VCMP to the other end of the variable capacitance element CV1 as the ground node side, and input the reference voltage VREF to the one end of the variable capacitance element CV1 as the capacitor CF1 side. Further, the variable capacitance element CV2 is also provided with substantially the same coupling configuration as that of the variable capacitance element CV1, but the detailed description will be omitted here.

According to such a configuration, it becomes possible to apply the voltage corresponding to the voltage difference between the temperature compensation voltage VCMP and the reference voltage VREF to the variable capacitance element CV1, and it becomes possible to change the capacitance value of the variable capacitance element CV1 using the temperature compensation voltage VCMP based on the reference voltage VREF to realize the temperature compensation of the oscillation frequency of the oscillation circuit 30. Further, by disposing the capacitor CF1 having the stationary capacitance, it becomes possible to adjust the bias voltage VBS and the reference voltage VREF independently of each other. In other words, it becomes possible to independently adjust the reference voltage VREF of the variable capacitance element CV1 such as a varactor at the same time as the duty adjustment by changing the bias voltage VBS. It becomes possible to adjust the reference voltage VREF so that a potential difference between both ends of the variable capacitance element CV1 becomes larger than 0 V, and at the same time, the sensitivity becomes optimum while performing the duty adjustment of changing the bias voltage VBS so that, for example, the duty ratio of the clock signal CK comes closer to 50%.

Further, in the present embodiment, the first duty adjustment circuit 50 outputs the bias voltage to the first node N1, and at the same time, outputs the reference voltage VREF to the other of the one end and the other end of the variable capacitance element CV1. For example, in FIG. 3, the temperature compensation voltage VCMP is input to the one end of the variable capacitance element CV1, and the first duty adjustment circuit 50 outputs the reference voltage VREF to the other end of the variable capacitance element CV1. It should be noted that it is possible to input the temperature compensation voltage VCMP to the other end of the variable capacitance element CV1, and it is possible for the first duty adjustment circuit 50 to output the reference voltage VREF to the one end of the variable capacitance element CV1.

By adopting such a configuration, using the single first duty adjustment circuit 50, it is possible to supply the bias voltage VBS to adjust the duty ratio of the clock signal CK, and at the same time, it becomes possible to supply the reference voltage VREF for the temperature compensation to realize the temperature compensation of the oscillation frequency. In other words, it becomes possible to supply the bias voltage VBS to adjust the duty ratio effectively using the first duty adjustment circuit 50 for supplying the reference voltage VREF for the temperature compensation. Thus, it becomes possible to realize commoditization of a circuit and reduction in scale of the circuit device 20, and to realize reduction in power consumption of the circuit device 20.

Specifically, as described in detail in FIG. 21 described later, the first duty adjustment circuit 50 includes the voltage-dividing circuit 52 and the selection circuit 54, wherein the voltage-dividing circuit 52 has a plurality of resistors coupled in series to each other between the power supply node and the ground node, and outputs a plurality of divisional voltages obtained by the plurality of resistors dividing the voltage, and the selection circuit 54 selects one of the divisional voltages as the bias voltage VBS. In other words, the voltage-dividing circuit 52 is realized by the ladder resistance circuit, and the selection circuit 54 selects the bias voltage VBS from the plurality of divisional voltages generated by the voltage-dividing circuit 52 as the ladder resistance circuit based on the adjustment data ADJ thus input, and then supplies the result to the first node N1. According to such a configuration, by generating the plurality of divisional voltages between, for example, the power supply voltage VREG1 and the ground voltage GND with the voltage-dividing circuit 52, and then selecting a voltage corresponding to the adjustment data ADJ from the plurality of divisional voltages thus generated, it becomes possible to generate the bias voltage VBS to become the central voltage of the oscillation signal XI.

Further, in the present embodiment, the selection circuit 54 selects the first divisional voltage which is one of the divisional voltages from the voltage-dividing circuit 52 as the bias voltage VBS, and selects the second divisional voltage which is one of the divisional voltages as the reference voltage VREF. In this way, by supplying the first divisional voltage selected by the selection circuit 54 from the plurality of divisional voltages to the first node N1 as the bias voltage VBS, it becomes possible to adjust the duty ratio of the clock signal CK. Further, by supplying the second divisional voltage selected by the selection circuit 54 from the plurality of divisional voltages as the reference voltage VREF, it becomes possible to make the variable capacitance element CV1 operate in an appropriate sensitivity range to realize the temperature compensation of the oscillation frequency. Further, since it is sufficient to dispose a single ladder resistance circuit as the voltage-dividing circuit 52 in order to generate the bias voltage VBS and the reference voltage VREF, it becomes possible to realize reduction in size of the circuit area of the circuit device 20 compared to when disposing a first ladder resistance circuit for the bias voltage and a second ladder resistance circuit for the reference voltage. Further, since it becomes possible to reduce the electrical current flowing from the power supply node to the ground node to, for example, about half compared to when disposing the first ladder resistance circuit and the second ladder resistance circuit, it is possible to realize reduction in power consumption of the circuit device 20.

3. Second Duty Adjustment Circuit

In recent years, information and communication terminals are sophisticated, and oscillators such as quartz crystal oscillators are required to have a multi-output function of distributing a clock signal to a baseband processing section, a chip set of RF/GPS, WLAN, or Bluetooth (a registered trademark), and so on. The processing speed is in an upward trend, and such a severe performance as within 50%±1% is required for the accuracy of the duty ratio of the clock signal in, for example, RF. In this regard, Document 1 described above discloses a method of inputting an input waveform of the inverter circuit in a shifted manner to thereby hold the voltage of the input signal, and thus performing a correction of the duty ratio of an output signal. However, in the method disclosed in Document 1, there is a problem that it is difficult to adjust a delay time between the input signal and the signal input in a shifted manner, and when attempting to realize the multi-output function described above, the duty ratio varies due to a circuit in a posterior stage, and thus, the high-accuracy duty ratio cannot be achieved.

The circuit device 20 according to the present embodiment which solves such a problem as described above includes the oscillation circuit 30 for generating the oscillation signals XI, XO, the waveform shaping circuit 40 for outputting the clock signal CK obtained by performing the waveform shaping on the oscillation signal XI, and the first duty adjustment circuit 50 for performing the duty adjustment of the clock signal CK as described with reference to FIG. 1 and FIG. 2. Further, the circuit device 20 includes the output buffer circuit 70 for outputting the output clock signals CKQ1, CKQ2 to the outside based on the clock signal CK, and the output buffer circuit 70 includes the second duty adjustment circuit 80 for performing the duty adjustment of the output clock signal CKQ2.

In this way, by the output buffer circuit 70 outputting the plurality of output clock signals CKQ1, CKQ2 based on the clock signal CK, it is possible to meet the requirement of the multi-output function of the clock signal. In this case, by the first duty adjustment circuit 50 performing the duty adjustment of the clock signal CK, it is possible to achieve the high-accuracy duty ratio of the clock signal CK.

However, when the output buffer circuit 70 performs buffering and so on, on the clock signal CK on which the duty adjustment has been performed to output the output clock signals CKQ1, CKQ2 to thereby realize the multi-output function, there is a possibility that the accuracy of the duty ratio becomes insufficient, and thus, the required specification of the duty accuracy required for the circuit device 20 cannot be fulfilled.

Therefore, in the present embodiment, the output buffer circuit 70 for outputting the output clock signals CKQ1, CKQ2 based on the clock signal CK is provided with the second duty adjustment circuit 80 for performing the duty adjustment of the output clock signal CKQ2. In this way, it becomes possible to achieve a two-stage duty adjustment in which the duty adjustment by the first duty adjustment circuit 50 is performed, and at the same time, the duty adjustment by the second duty adjustment circuit 80 is performed. For example, it is assumed that there occurs a situation in which the required specification of the duty accuracy with respect to the output clock signal CKQ1 is fulfilled by the duty adjustment with the first duty adjustment circuit, but the required specification of the duty accuracy with respect to the output clock signal CKQ2 is not fulfilled. Such a situation occurs when, for example, the output clock signal CKQ2 as the second output clock signal is a signal different in phase from the output clock signal CKQ1 as the first output clock signal.

Even in such a case, due to the duty adjustment by the second duty adjustment circuit 80 provided to the output buffer circuit 70, it becomes possible to make the required specification of the duty accuracy also be fulfilled with respect to the output clock signal CKQ2. Thus, it becomes possible for the output buffer circuit 70 to output the plurality of output clock signals CKQ1, CKQ2 which can fulfill such a required specification of the duty accuracy as 50%±1% to the outside, and thus, it becomes possible to realize both of the multi-output function of the clock signal and the high-accuracy duty adjustment.

Figure 9:
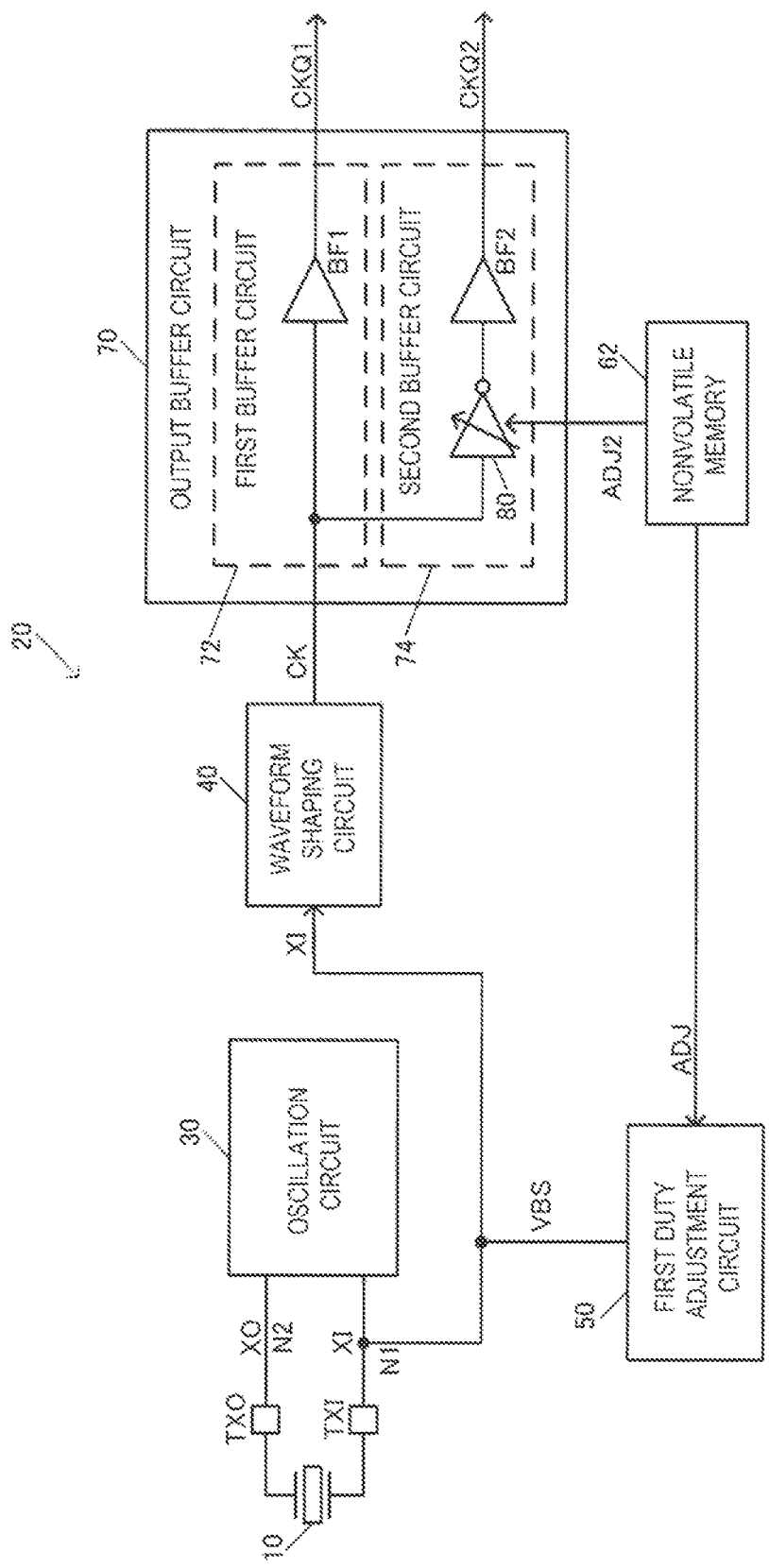
FIG. 9 is a diagram showing a configuration example of the circuit device for explaining the detail of a second duty adjustment circuit.

For example, FIG. 9 shows a configuration example of the circuit device 20 for explaining the detail of the second duty adjustment circuit 80. As shown in FIG. 9, the first duty adjustment circuit 50 supplies the first node N1 with the bias voltage VBS which is variably adjusted based on, for example, the adjustment data ADJ to thereby adjust the duty ratio of the clock signal CK. Thus, the clock signal CK the duty ratio of which is adjusted with high accuracy becomes to be input to the output buffer circuit 70 from the waveform shaping circuit 40. Further, the output buffer circuit 70 outputs the output clock signals CKQ1, CKQ2 based on the clock signal CK on which the duty adjustment has been performed by the first duty adjustment circuit 50.

On this occasion, when measuring the duty ratio of the output clock signal CKQ1 to decide the adjustment data ADJ in advance based on the measurement result as, for example, described above, by the first duty adjustment circuit 50 performing the duty adjustment based on the adjustment data ADJ, it becomes possible to fulfill the required specification of the duty accuracy with respect to the output clock signal CKQ1. However, the output clock signal CKQ2 is different in phase from, for example, the output clock signal CKQ1, and in FIG. 9, the difference in phase is 180 degrees. Therefore, even when the duty ratio of the output clock signal CKQ1 is supposedly adjusted with high accuracy so as to fulfill the required specification, the duty ratio of the output clock signal CKQ2 does not necessarily fulfill the required specification of the duty accuracy. For example, when outputting a reversed-phase clock signal different in phase as much as 180 degrees from the output clock signal CKQ1 as the output clock signal CKQ2, an inverter circuit for inverting the signal level becomes necessary. In this case, when imbalance supposedly exists between the drive capacities of the P-type transistor and the N-type transistor constituting the inverter circuit, there occurs a situation in which a variation occurs in the duty ratio of the output clock signal CKQ2. For example, in the case of SF in which the N-type transistor and the P-type transistor are Slow and Fast, respectively, and the case of FS in which the N-type transistor and the P-type transistor are Fast and Slow, respectively, such a situation as described above occurs, and it becomes unachievable to realize the high-accuracy duty ratio of the output clock signal CKQ2.

In this regard, in the present embodiment, the output buffer circuit 70 is provided with the second duty adjustment circuit 80, and the second duty adjustment circuit 80 performs the duty adjustment with respect to the output clock signal CKQ2. For example, the duty ratio of the output clock signal CKQ2 is measured, the adjustment data ADJ2 is decided based on the measurement result, and then the second duty adjustment circuit 80 performs the duty adjustment of the output clock signal CKQ2 based on the adjustment data ADJ2. In this way, the high-accuracy duty adjustment becomes to be performed not only on the output clock signal CKQ1 but also on the output clock signal CKQ2, and the result becomes to be output to the outside. Thus, it becomes possible to realize both of the multi-output function of the clock signal and the high-accuracy duty adjustment.

Specifically, in FIG. 9, the output buffer circuit includes a first buffer circuit 72 and a second buffer circuit 74. The first buffer circuit 72 buffers the clock signal CK and then outputs the clock signal CK as the output clock signal CKQ1. For example, the first buffer circuit 72 has a buffer circuit BF1, and a signal obtained by buffering the clock signal CK with the buffer circuit BF1 is output as the output clock signal CKQ1. In this case, the output clock signal CKQ1 is a non-inverted signal of the clock signal CK, and the output clock signal CKQ1 becomes a clock signal the same in phase as the clock signal CK. Further, the buffer circuit BF1 can be realized by, for example, a plurality of inverter circuits and so on. The buffer circuit BF1 has a high drive capacity so as to be able to drive an external load, and is higher in drive capacity than, for example, the waveform shaping circuit 40. Specifically, the buffer circuit BF1 is constituted by a P-type transistor and an N-type transistor larger in size compared to those of the waveform shaping circuit 40.

Meanwhile, the second buffer circuit 74 has a second duty adjustment circuit 80, and buffers the clock signal CK to output the output clock signal CKQ2 the duty ratio of which is adjusted by the second duty adjustment circuit 80. For example, the clock signal CK from the waveform shaping circuit 40 is input to the second duty adjustment circuit 80, and the second duty adjustment circuit 80 performs inversion of the signal level of the clock signal CK, and at the same time, performs the duty adjustment. Further, an output signal of the second duty adjustment circuit 80 is buffered by the buffer circuit BF2, and is then output as the output clock signal CKQ2. In this case, the output clock signal CKQ2 is an inverted signal of the clock signal CK, and the output clock signal CKQ2 becomes a clock signal different in phase from the output clock signal CKQ1 and the clock signal CK. Specifically, the output clock signal CKQ2 is different in phase as much as 180 degrees from the output clock signal CKQ1 and the clock signal CK. Further, the buffer circuit BF2 can be realized by, for example, a plurality of inverter circuits and so on. The buffer circuit BF2 has a high drive capacity so as to be able to drive an external load, and is higher in drive capacity than, for example, the second duty adjustment circuit 80 and the waveform shaping circuit 40. Specifically, the buffer circuit BF2 is constituted by a P-type transistor and an N-type transistor larger in size compared to those of the second duty adjustment circuit 80 and the waveform shaping circuit 40.

As described above, in FIG. 9, in a first signal path branched from an intermediate node of the output buffer circuit 70, the clock signal CK is buffered by the first buffer circuit 72, and is then output as the output clock signal CKQ1. Further, in a second signal path branched from the intermediate node, the second buffer circuit 74 buffers the clock signal CK, inverts the signal level of the clock signal CK, and at the same time, performs the duty adjustment to output the result as the output clock signal CKQ2. By providing the first buffer circuit 72 and the second buffer circuit 74 described above to the output buffer circuit 70, it becomes possible to output the signal obtained by buffering the clock signal CK to the outside as the output clock signal CKQ1, and at the same time, it becomes possible to output the signal which is obtained by buffering the clock signal CK, and the duty ratio of which is adjusted by the second duty adjustment circuit 80 to the outside as the output clock signal CKQ2. Therefore, it becomes possible to output the plurality of output clock signals CKQ1, CKQ2 on which the duty adjustment has been performed with high accuracy to the outside, and thus, it becomes possible to realize both of the multi-output function of the clock signal and the high-accuracy duty adjustment.

Further, in the present embodiment, the output clock signal CKQ1 and the output clock signal CKQ2 are the clock signals different in phase as much as 180 degrees from each other. For example, the output clock signal CKQ1 is the non-inverted signal of the clock signal CK, and is the same in phase as the clock signal CK, but the output clock signal CKQ2 is the inverted signal of the clock signal CK, and is different in phase as much as 180 degrees from the clock signal CK, and is also different in phase as much as 180 degrees from the output clock signal CKQ1. In this way, it is possible to output the output clock signal CKQ1 and the output clock signal CKQ2 different in phase as much as 180 degrees from the output clock signal CKQ1 to the outside to thereby realize the multi-output function, and at the same time, it becomes possible to output the plurality of output clock signals CKQ1, CKQ2 on which the high-accuracy duty adjustment has been performed to the outside. Therefore, when not only the output clock signal CKQ1 the same in phase as the clock signal CK but also the clock signal different in phase as much as 180 degrees from the output clock signal CKQ1 are required in the outside of the circuit device 20, it becomes possible to supply these output clock signals CKQ1, CKQ2 on which the duty adjustment is performed with high accuracy to the outside in response to such a request.

It should be noted that in FIG. 9, the output clock signals CKQ1, CKQ2 are different in phase as much as 180 degrees from each other, but the present embodiment is not limited thereto, and a variety of types of modified implementation such as making the phases different as much as 90 degrees from each other are possible. Further, in FIG. 9, the output buffer circuit 70 outputs the two output clock signals CKQ1, CKQ2, but it is possible to arrange that the output buffer circuit 70 can output three or more output clock signals.

Further, as shown in FIG. 9, the first duty adjustment circuit 50 performs the duty adjustment of the clock signal CK based on the adjustment data ADJ stored in the nonvolatile memory 62, and the second duty adjustment circuit 80 performs the duty adjustment of the output clock signal CKQ2 based on the adjustment data ADJ2 stored in the nonvolatile memory 62. Specifically, in the inspection step in, for example, manufacturing the circuit device 20, the duty ratio of the output clock signal CKQ1 is measured, and the adjustment data ADJ is decided based on the measurement result. Further, the duty ratio of the output clock signal CKQ2 is measured, and then the adjustment data ADJ2 is decided based on the measurement result.

Then, the adjustment data ADJ, ADJ2 thus decided are written into the nonvolatile memory 62. Then, when the circuit device 20 actually operates, the adjustment data ADJ, ADJ2 decided based on the measurement result are retrieved from the nonvolatile memory 62, the first duty adjustment circuit 50 performs the duty adjustment based on the adjustment data ADJ, and the second duty adjustment circuit 80 performs the duty adjustment based on the adjustment data ADJ2. For example, in the second duty adjustment circuit 80, there is performed a ratio adjustment between the drive capacities of the p-type transistor and the N-type transistor constituting the inverter circuit of the second duty adjustment circuit 80 based on the adjustment data ADJ2. The ratio adjustment between the drive capacities can be realized by a ratio adjustment between the sizes of the P-type transistor and the N-type transistor constituting the inverter circuit. In this way, it becomes possible to output the output clock signals CKQ1, CKQ2 on which the duty adjustment with such high accuracy as within, for example, 50%±1% is performed to the outside.

Figure 10:
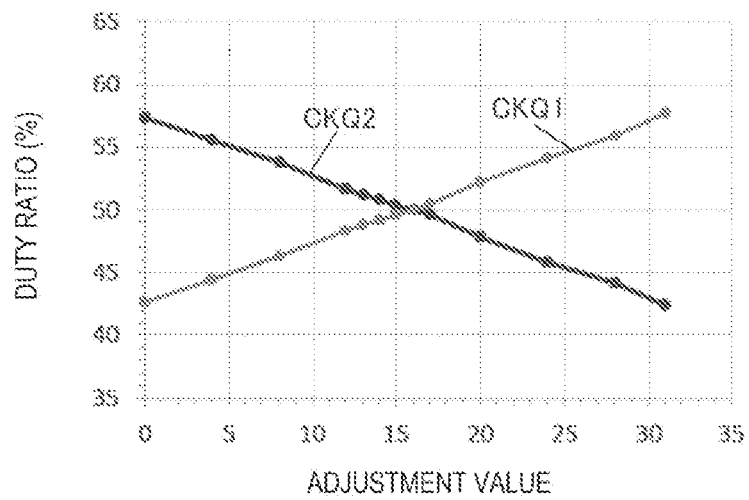
FIG. 10 is a graph showing a relationship between an adjustment value of adjustment data and a duty ratio.
Figure 11:
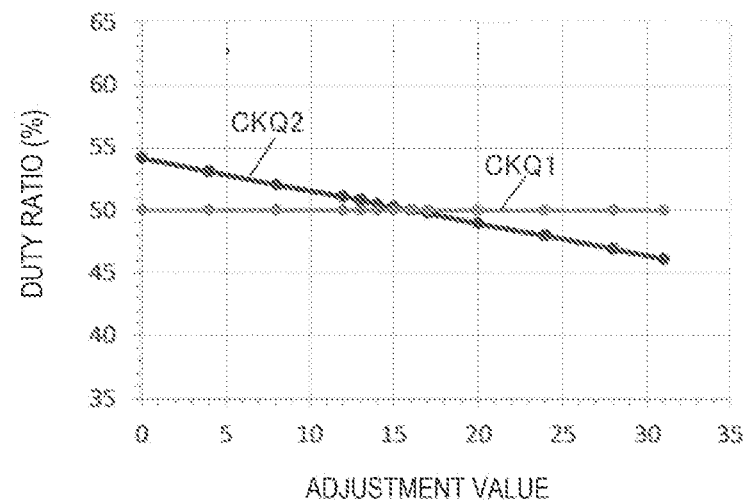
FIG. 11 is a graph showing a relationship between the adjustment value of the adjustment data and the duty ratio.

For example, FIG. 10 and FIG. 11 are each a graph showing a relationship between the adjustment value of the adjustment data ADJ, ADJ2 and the duty ratio. In a first-stage duty adjustment shown in FIG. 10, there is performed the duty adjustment in which 50%±8% is sliced into 32 steps in five bits based on, for example, the adjustment data ADJ, and there is performed the duty adjustment with the resolution of 0.4%. In a second-stage duty adjustment shown in FIG. 11, there is performed the duty adjustment in which 50%±4% is sliced into 32 steps in five bits based on, for example, the adjustment data ADJ2, and there is performed the duty adjustment with the resolution of 0.2%. As described above, in the present embodiment, the resolution of the duty adjustment of the second duty adjustment circuit 80 is made equivalent to or higher than the resolution of the duty adjustment of the first duty adjustment circuit 50. Further, due to the duty adjustment by the first duty adjustment circuit shown in FIG. 10, the high-accuracy duty adjustment achieving the accuracy within 50%±1% is performed with respect to the output clock signal CKQ1, but the accuracy of the duty adjustment becomes insufficient with respect to the output clock signal CKQ2 different in phase from the output clock signal CKQ1 as shown in FIG. 11. Therefore, by the second duty adjustment circuit 80 performing the duty adjustment, such a high-accuracy duty adjustment that the duty ratio becomes within 50%±1% is also realized with respect to the output clock signal CKQ2.

Figure 12:
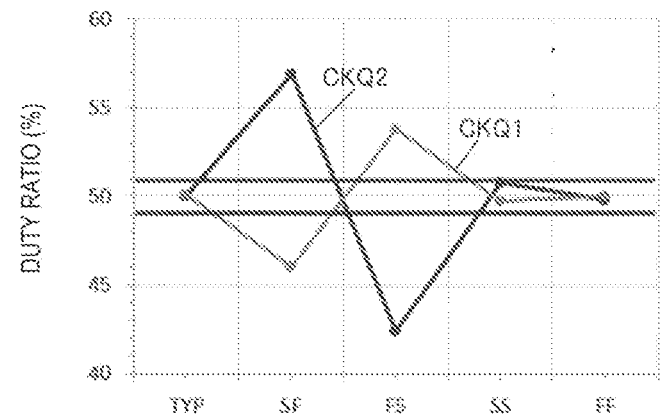
FIG. 12 is a graph showing a process fluctuation of a duty ratio of an output clock signal.

FIG. 12 shows a corner simulation result of the process fluctuation of the duty ratio of the output clock signals CKQ1, CKQ2 when the duty adjustments by the first duty adjustment circuit 50 and the second duty adjustment circuit 80 have not been performed. As shown in FIG. 12, in SF in which the N-type transistor is Slow, and the P-type transistor is Fast, the duty ratio changes so as to become lower than 50% with respect to the output clock signal CKQ1, and the duty ratio changes so as to become higher than 50% with respect to the output clock signal CKQ2. In FS in which the N-type transistor is Fast, and the P-type transistor is Slow, the duty ratio changes so as to become higher than 50% with respect to the output clock signal CKQ1, and the duty ratio changes so as to become lower than 50% with respect to the output clock signal CKQ2.

Figure 13:
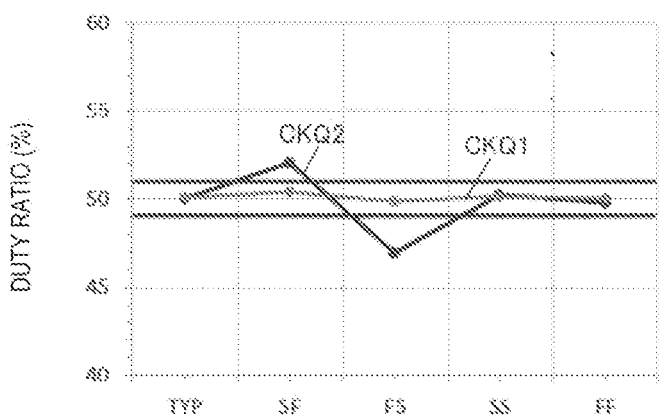
FIG. 13 is a graph showing the process fluctuation of the duty ratio of the output clock signal when performing the duty adjustment of the first duty adjustment circuit.

FIG. 13 shows a corner simulation result of the process fluctuation of the duty ratio of the output clock signals CKQ1, CKQ2 when the duty adjustment by the first duty adjustment circuit 50 has been performed. As shown in FIG. 13, with respect to the output clock signal CKQ1, such a high-accuracy duty adjustment that the duty ratio becomes within 50%±1% is realized, but the duty ratio exceeds the range of 50%±1% with respect to the output clock signal CKQ2 different in phase from the output clock signal CKQ1. In other words, with respect to the output clock signal CKQ2, the high-accuracy duty ratio is not sufficiently achieved only by the duty adjustment with the first duty adjustment circuit 50.

Figure 14:
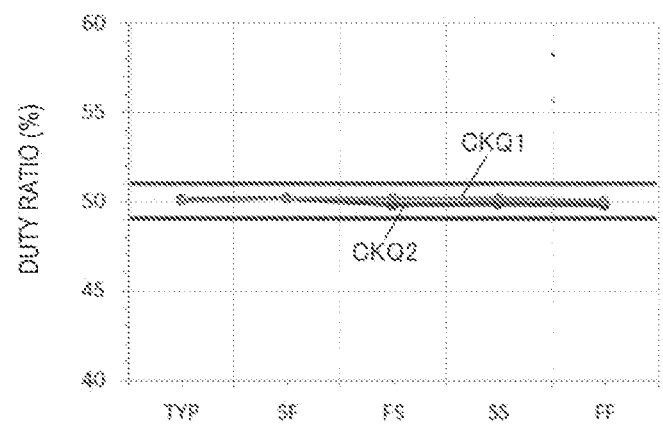
FIG. 14 is a graph showing the process fluctuation of the duty ratio of the output clock signal when performing the duty adjustment of the first duty adjustment circuit and the second duty adjustment circuit.

FIG. 14 shows a corner simulation result of the process fluctuation of the duty ratio of the output clock signals CKQ1, CKQ2 when both of the duty adjustments by the first duty adjustment circuit 50 and the second duty adjustment circuit 80 have been performed. As shown in FIG. 14, by performing both of the duty adjustments by the first duty adjustment circuit 50 and the second duty adjustment circuit 80, there is realized such a high-accuracy duty adjustment that the duty ratio becomes within 50%±1% with respect to both of the output clock signals CKQ1, CKQ2. As described above, according to the present embodiment, it becomes possible to realize both of the multi-output function of the clock signal and the high-accuracy duty adjustment.

Figure 15:
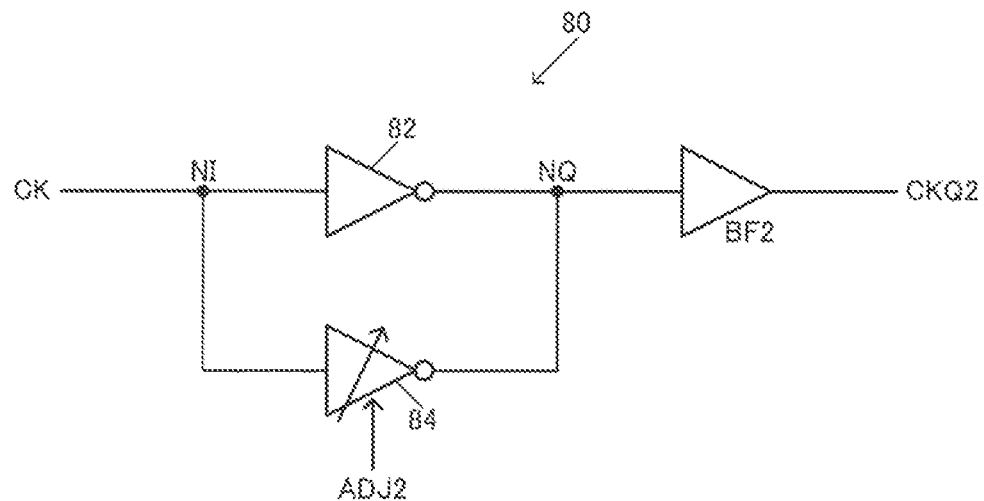
FIG. 15 is a diagram showing a configuration example of the second duty adjustment circuit.

FIG. 15 shows a configuration example of the second duty adjustment circuit 80. In FIG. 15, the second duty adjustment circuit 80 includes a reference inverter circuit 82 and a duty adjusting inverter circuit 84 coupled in parallel to each other. The reference inverter circuit 82 outputs a signal obtained by buffering the clock signal CK to an output node NQ. The reference inverter circuit 82 is, for example, an always-on inverter circuit, and a signal obtained by inverting the signal level of the clock signal CK input to an input node N1 is output by the reference inverter circuit 82 to the output node NQ. The duty adjusting inverter circuit 84 is coupled in parallel to the reference inverter circuit 82, and outputs the signal obtained by buffering the clock signal CK to the output node NQ. In the duty adjusting inverter circuit 84, the drive capacities of a P-type transistor and an N-type transistor are set in accordance with, for example, the adjustment data ADJ2, and the signal obtained by inverting the signal level of the clock signal CK input to the input node N1 is output to the output node NQ. Further, the buffer circuit BF2 disposed in a posterior stage of the second duty adjustment circuit 80 buffers the signal output to the output node to output the result as the output clock signal CKQ2. In this way, the duty adjusting inverter circuit 84 is coupled in parallel to the reference inverter circuit 82 which always operates after, for example, powered on, and the clock signal CK becomes to be buffered, and the duty adjustment of the output clock signal CKQ2 by the duty adjusting inverter circuit 84 becomes possible.

For example, the reference inverter circuit 82 is a main inverter circuit of the second duty adjustment circuit 80. Further, as shown in FIG. 9, by disposing the reference inverter circuit 82 of the second duty adjustment circuit 80 in the second signal path branched from the first signal path of the output clock signal CKQ1 to invert the signal level of the clock signal CK with the reference inverter circuit 82, it becomes possible to output the output clock signal CKQ2 different in phase as much as 180 degrees from the output clock signal CKQ1.

In this case, imbalance caused by the process fluctuation and so on occurs between the drive capacities of the P-type transistor and the N-type transistor constituting the reference inverter circuit 82 in some cases. For example, in the case of SF in which the N-type transistor is Slow and the P-type transistor is Fast, there occurs the imbalance that the drive capacity of the N-type transistor becomes lower than the drive capacity of the P-type transistor. In the case of FS in which the N-type transistor is Fast and the P-type transistor is Slow, there occurs the imbalance that the drive capacity of the P-type transistor becomes lower than the drive capacity of the N-type transistor. Further, when such imbalance in drive capacity occurs, the duty ratio of the output clock signal CKQ2 generated by the signal inversion by the reference inverter circuit 82 fluctuates.

Therefore, in FIG. 15, there is disposed the duty adjusting inverter circuit 84 to be coupled in parallel to the reference inverter circuit 82 as the main inverter circuit. In the duty adjusting inverter circuit 84, the input is coupled to the input node N1 common to the reference inverter circuit 82, and the output is coupled to the output node NQ common to the reference inverter circuit 82. Further, in the duty adjusting inverter circuit 84, it is arranged that it is possible to variably adjust the drive capacities of the P-type transistor and the N-type transistor constituting the duty adjusting inverter circuit 84 based on the adjustment data ADJ2. For example, it is arranged that ratio information between the drive capacities can variably be adjusted.

For example, it is assumed that the imbalance that the drive capacity of the N-type transistor of the reference inverter circuit 82 becomes lower than the drive capacity of the P-type transistor occurs due to the process fluctuation in which the N-type transistor is Slow and the P-type transistor is Fast. In this case, there is performed the adjustment of increasing the drive capacity at the N-type transistor side of the duty adjusting inverter circuit 84 based on the adjustment data ADJ2. On the other hand, it is assumed that the imbalance that the drive capacity of the P-type transistor of the reference inverter circuit 82 becomes lower than the drive capacity of the N-type transistor occurs due to the process fluctuation in which the N-type transistor is Fast and the P-type transistor is Slow. In this case, there is performed the adjustment of increasing the drive capacity at the P-type transistor side of the duty adjusting inverter circuit 84 based on the adjustment data ADJ2. In this way, it becomes possible to highly accurately adjust the duty ratio of the output clock signal CKQ2 which has not sufficiently made high-accuracy only with the first adjustment circuit 50 as shown in FIG. 13, and thus, realize such a high-accuracy duty adjustment as within 50%±1% as shown in FIG. 14.

Further, in FIG. 15, the size of each of the P-type transistor and the N-type transistor constituting the duty adjusting inverter circuit 84 is made no larger than a half of the size of each of the P-type transistor and the N-type transistor constituting the reference inverter circuit 82. For example, the size of the P-type transistor constituting the duty adjusting inverter circuit 84 is no larger than a half of the size of the P-type transistor constituting the reference inverter circuit 82, and the size of the N-type transistor constituting the duty adjusting inverter circuit is no larger than a half of the size of the N-type transistor constituting the reference inverter circuit 82. Here, when denoting the gate width of the transistor by W, and the gate length thereof by L, the size of the transistor can be represented as, for example, W/L. For example, when two transistors are the same in gate length L as each other, the size of the transistor can be represented by the gate width W. By making the size of the transistor of the duty adjusting inverter circuit 84 no larger than a half of the size of the transistor of the reference inverter circuit 82 in such a manner, it becomes possible to adjust the drive capacity at the P-type transistor side and the drive capacity at the N-type transistor side with the duty adjusting inverter circuit 84 based on the adjustment data ADJ2 with reference to the drive capacities of the P-type transistor and the N-type transistor of the reference inverter circuit 82. Therefore, even when there occurs such a process fluctuation as to cause the imbalance in the drive capacities of the P-type transistor and the N-type transistor, it becomes possible to prevent the duty ratio of the output clock signal CKQ2 from fluctuating to thereby realize the high-accuracy duty adjustment. It should be noted that hereinafter the drive capacity at the P-type transistor side is arbitrarily described as the drive capacity at P side, and the drive capacity at the N-type transistor side is arbitrarily described as the drive capacity at N side.

Figure 16:
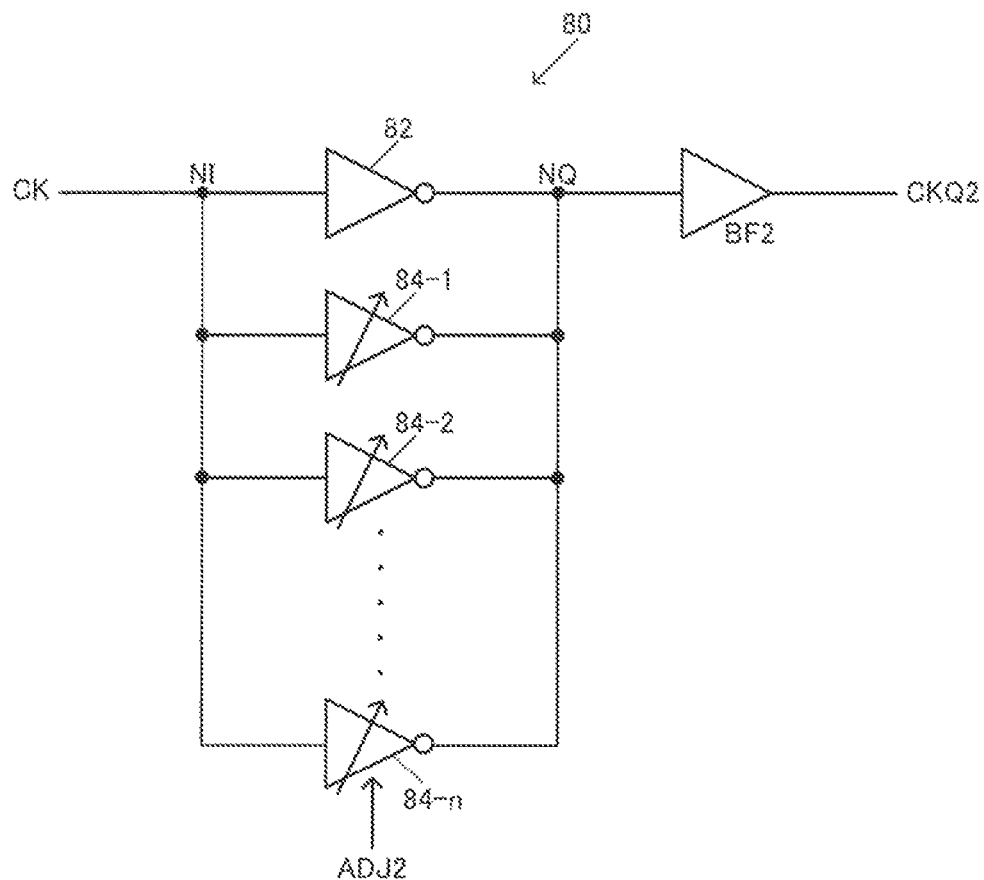
FIG. 16 is a diagram showing a detailed configuration example of the second duty adjustment circuit.

Further, as shown in FIG. 16, the second duty adjustment circuit 80 includes a first duty adjusting inverter circuit 84-1 and a second duty adjusting inverter circuit 84-2. The first duty adjusting inverter circuit 84-1 is coupled in parallel to the reference inverter circuit 82, and outputs the signal obtained by buffering the clock signal CK to the output node NQ. The second duty adjusting inverter circuit 84-2 is also coupled in parallel to the reference inverter circuit 82, and outputs the signal obtained by buffering the clock signal CK to the output node NQ. Further, the size of each of the P-type transistor and the N-type transistor constituting the second duty adjusting inverter circuit 84-2 is made twice as large as the size of each of the P-type transistor and the N-type transistor constituting the first duty adjusting inverter circuit 84-1. In this way, it becomes possible to achieve such an adjustment as to add the drive capacities at the P side and the N side of the first duty adjusting inverter circuit 84-1 and the drive capacities at the P side and the N side of the second duty adjusting inverter circuit 84-2 to the drive capacities at the P side and the N side of the reference inverter circuit 82 in a binary-weighted manner based on the adjustment data ADJ2. Thus, it becomes possible to achieve a duty adjustment higher in resolution, and it is possible to realize the high-accuracy duty adjustment.

It should be noted that the adjustment of the drive capacities at the P side and the N side of the first duty adjusting inverter circuit 84-1 and the second duty adjusting inverter circuit 84-2 is an adjustment of increasing the drive capacity at the P-type transistor side, or an adjustment of increasing the drive capacity at the N-type transistor side. It is arranged that, for example, the drive capacity at the P-type transistor side is increased when each of the bits of the adjustment data ADJ2 is at a first logic level such as a low level, and the drive capacity at the N-type transistor side is increased when each of the bits of the adjustment data ADJ2 is at a second logic level such as a high level.

Further, in FIG. 16, the second duty adjustment circuit 80 includes the first duty adjusting inverter circuit 84-1, and the second through n-th duty adjusting inverter circuits 84-2 through 84-n which are coupled in parallel to the reference inverter circuit 82, and each emit the signal obtained by buffering the clock signal CK to the output node NQ. Further, as described in detail in FIG. 17, the P-type transistor and the N-type transistor of each of the first through n-th duty adjusting inverter circuits 84-1 through 84-n are controlled by control signals DT1 through DTn so that one of the P-type transistor and the N-type transistor is set to an ON state, and the other thereof is set to an OFF state. In other words, the control signals DT1 through DTn for setting either one of the P-type transistor and the N-type transistor of each of the duty adjusting inverter circuits to the ON state, and setting the other thereof to the OFF state are input to the first through n-th duty adjusting inverter circuits 84-1 through 84-n, respectively. Here, the control signals DT1 through DTn correspond to first through n-th control signals, and are signals set based on the adjustment data ADJ2. Citing FIG. 2 as an example, the processing circuit 60 outputs the control signals DT1 through DTn based on the adjustment data ADJ2 retrieved from the nonvolatile memory 62.

Further, the sizes of the P-type transistors and the N-type transistors constituting the first through n-th duty adjusting inverter circuits 84-1 through 84-n are binary-weighted. For example, the size of each of the P-type and N-type transistors of the second duty adjusting inverter circuit 84-2 is made twice as large as the size of each of the P-type and N-type transistors of the first duty adjusting inverter circuit 84-1. Further, the size of each of the P-type and N-type transistors of the third duty adjusting inverter circuit 84-3 is made twice as large as the size of each of the P-type and N-type transistors of the second duty adjusting inverter circuit 84-2.

In this way, it becomes possible to achieve such an adjustment as to add the drive capacities at the P side and the N side of the first through n-th duty adjusting inverter circuits 84-1 through 84-n to the drive capacities at the P side and the N side of the reference inverter circuit 82 in a binary-weighted manner based on the adjustment data ADJ2. Thus, it becomes possible to achieve the duty adjustment high in resolution, and it is possible to realize the high-accuracy duty adjustment.

Figure 17:
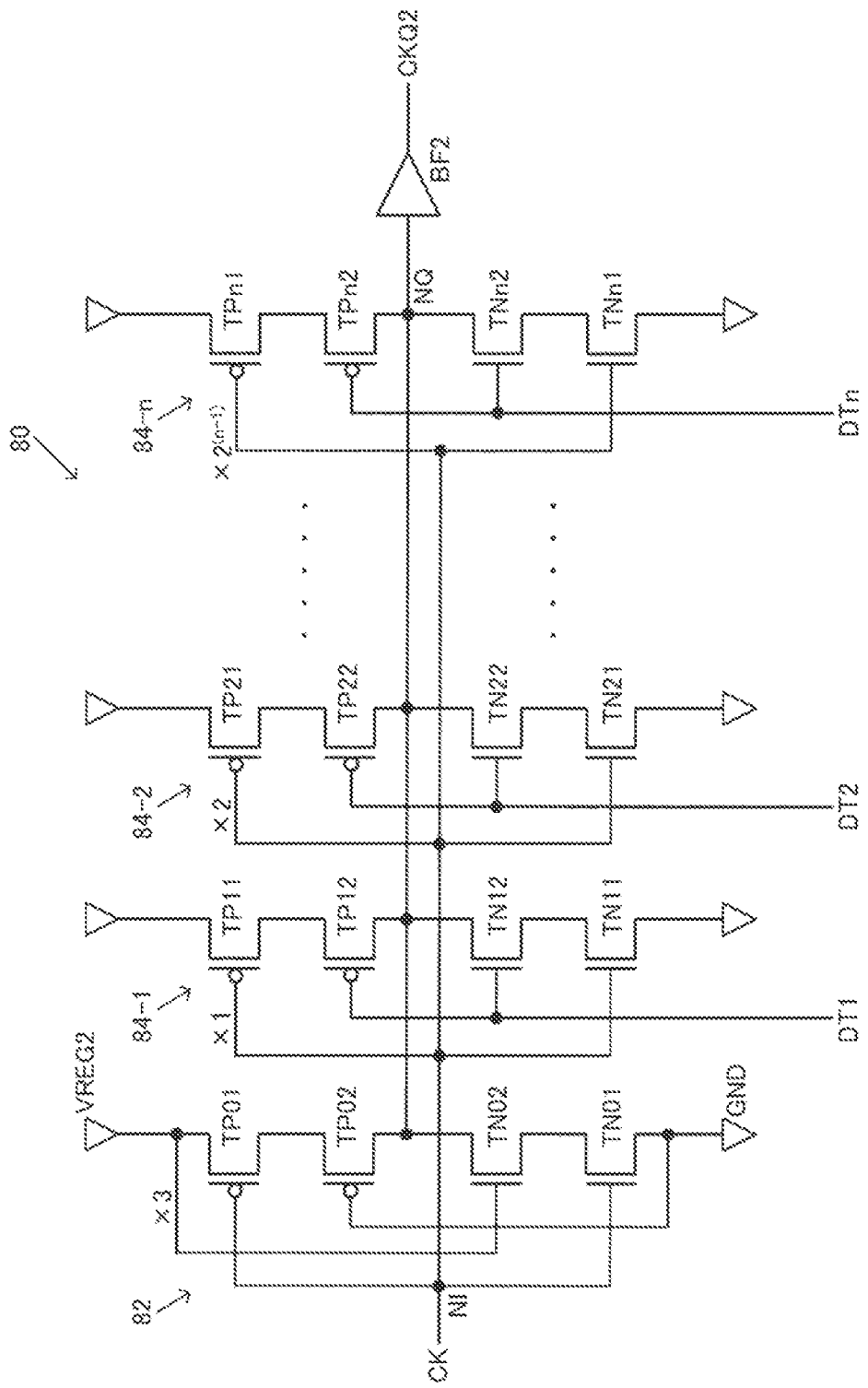
FIG. 17 is a diagram showing a detailed configuration example of the second duty adjustment circuit.

FIG. 17 shows a detailed configuration example of the second duty adjustment circuit 80. As shown in FIG. 17, the reference inverter circuit 82 of the second duty adjustment circuit 80 includes P-type transistors TP01, TP02 coupled in series between the power supply node of the power supply voltage VREG2 and the output node NQ, and N-type transistors TN01, TN02 coupled in series between the ground node and the output node NQ. Further, the clock signal CK is input to the gate of each of the P-type transistor TP01 and the N-type transistor TN01. Further, the P-type transistor TP02 is coupled to the ground node in the gate thereof to thereby be always-on, and the N-type transistor TN02 is coupled to the power supply node in the gate thereof to thereby be always-on. As described above, the reference inverter circuit 82 forms an always-on inverter circuit.

Further, as shown in FIG. 17, the first duty adjusting inverter circuit 84-1 as the duty adjusting inverter circuit includes P-type transistors TP11, TP12 coupled in series between the power supply node of the power supply voltage VREG2 and the output node NQ, and N-type transistors TN11, TN12 coupled in series between the ground node and the output node NQ. The P-type transistor TP11 corresponds to a first P-type transistor, and the P-type transistor TP12 corresponds to a second P-type transistor. The N-type transistor TN11 corresponds to a first N-type transistor, and the N-type transistor TN12 corresponds to a second N-type transistor.

Further, the clock signal CK is input to the gate of each of the P-type transistor TP11 as the first P-type transistor and the N-type transistor TN11 as the first N-type transistor. Meanwhile, the control signal DT1 as a common first control signal is input to the gate of each of the P-type transistor TP12 as the second P-type transistor and the N-type transistor TN12 as the second N-type transistor.

In this way, when the control signal DT1 is in the low level as the first logic level, the P-type transistor TP12 is set to an ON state, and the N-type transistor TN12 is set to an OFF state. Thus, it becomes possible to add the drive capacity at the P side due to the P-type transistors TP11, TP12 of the first duty adjusting inverter circuit 84-1 to the drive capacity at the P side of the reference inverter circuit 82. Therefore, when there occurs such imbalance that the drive capacity at the P side of the reference inverter circuit 82 lowers due to the process fluctuation in which the P-type transistor becomes Slow and so on, by the first duty adjusting inverter circuit 84-1 adding the drive capacity at the P side, it becomes possible to resolve the imbalance. Thus, it becomes possible to suppress the fluctuation of the duty ratio of the output clock signal CKQ2 caused by the imbalance, and thus, it becomes possible to realize the high-accuracy duty adjustment.

Further, when the control signal DT1 is in the high level as the second logic level, the P-type transistor TP12 is set to the OFF state, and the N-type transistor TN12 is set to the ON state. Thus, it becomes possible to add the drive capacity at the N side due to the N-type transistors TN11, TN12 of the first duty adjusting inverter circuit 84-1 to the drive capacity at the N side of the reference inverter circuit 82. Therefore, when there occurs such imbalance that the drive capacity at the N side of the reference inverter circuit 82 lowers due to the process fluctuation in which the N-type transistor becomes Slow and so on, by the first duty adjusting inverter circuit 84-1 adding the drive capacity at the N side, it becomes possible to resolve the imbalance. Thus, it becomes possible to suppress the fluctuation of the duty ratio of the output clock signal CKQ2 caused by the imbalance, and thus, it becomes possible to realize the high-accuracy duty adjustment.

Further, in FIG. 17, the second duty adjustment circuit 80 includes the second duty adjusting inverter circuit 84-2 which is coupled in parallel to the reference inverter circuit 82, and outputs the signal obtained by buffering the clock signal CK to the output node NQ. Further, the second duty adjusting inverter circuit 84-2 includes P-type transistors TP21, TP22 coupled in series between the power supply node and the output node NQ, and N-type transistors TN21, TN22 coupled in series between the ground node and the output node NQ. The P-type transistor TP21 corresponds to a third P-type transistor, and the P-type transistor TP22 corresponds to a fourth P-type transistor. The N-type transistor TN21 corresponds to a third N-type transistor, and the N-type transistor TN22 corresponds to a fourth N-type transistor.

Further, the clock signal CK is input to the gate of each of the P-type transistor TP21 as the third P-type transistor and the N-type transistor TN21 as the third N-type transistor. Meanwhile, the control signal DT2 as a common second control signal is input to the gate of each of the P-type transistor TP22 as the fourth P-type transistor and the N-type transistor TN22 as the fourth N-type transistor.

In this way, when the control signal DT2 is in the low level, the P-type transistor TP22 is set to the ON state, and the N-type transistor TN22 is set to the OFF state. Thus, it becomes possible to add the drive capacity at the P side due to the P-type transistors TP21, TP22 of the second duty adjusting inverter circuit 84-2 to the drive capacity at the P side of the reference inverter circuit 82. Therefore, when there occurs such imbalance that the drive capacity at the P side of the reference inverter circuit 82 lowers, by the second duty adjusting inverter circuit 84-2 adding the drive capacity at the P side, it becomes possible to resolve the imbalance. Further, when the control signal DT2 is in the high level, the P-type transistor TP22 is set to the OFF state, and the N-type transistor TN22 is set to the ON state. Thus, it becomes possible to add the drive capacity at the N side due to the N-type transistors TN21, TN22 of the second duty adjusting inverter circuit 84-2 to the drive capacity at the N side of the reference inverter circuit 82. Therefore, when there occurs such imbalance that the drive capacity at the N side of the reference inverter circuit 82 lowers, by the second duty adjusting inverter circuit 84-2 adding the drive capacity at the N side, it becomes possible to resolve the imbalance. Thus, it becomes possible to suppress the fluctuation of the duty ratio of the output clock signal CKQ2, and thus, it becomes possible to realize the high-accuracy duty adjustment.

Further, in FIG. 17, the second duty adjustment circuit 80 includes the n-th duty adjusting inverter circuit 84-n which is coupled in parallel to the reference inverter circuit 82, and outputs the signal obtained by buffering the clock signal CK to the output node NQ. Further, the n-th duty adjusting inverter circuit 84-n includes P-type transistors TPn1, TPn2 coupled in series between the power supply node and the output node NQ, and N-type transistors TNn1, TNn2 coupled in series between the ground node and the output node NQ. Further, the clock signal CK is input to the gate of each of the P-type transistor TPn1 and the N-type transistor TNn1, and the control signal DTn as a common n-th control signal is input to the gate of each of the P-type transistor TPn2 and the N-type transistor TNn2. Further, when the control signal DTn is in the low level, it becomes possible to add the drive capacity at the P side due to the P-type transistors TPn1, TPn2 of the n-th duty adjusting inverter circuit 84-n to the drive capacity at the P side of the reference inverter circuit 82. Further, when the control signal DTn is in the high level, it becomes possible to add the drive capacity at the N side due to the N-type transistors TNn1, TNn2 of the n-th duty adjusting inverter circuit 84-n to the drive capacity at the N side of the reference inverter circuit 82.

It should be noted that in FIG. 17, the control signals DT1 through DTn as the first through n-th control signals are signals set based on the adjustment data ADJ2. Further, in FIG. 17, the size of each of the P-type and N-type transistors of the first duty adjusting inverter circuit 84-1 is made no larger than a half of the size of corresponding one of the P-type and N-type transistors of the reference inverter circuit 82, and is specifically made a third thereof. Further, the size of each of the P-type and N-type transistors of the second duty adjusting inverter circuit 84-2 is made twice as large as the size of corresponding one of the P-type and N-type transistors of the first duty adjusting inverter circuit 84-1. Specifically, the sizes of the P-type and N-type transistors of the first through n-th duty adjusting inverter circuits 84-1 through 84-n are binary-weighted.

4. Modified Examples

The circuit device 20 according to the present embodiment is not limited to the configuration example described hereinabove, but can be put into practice with a variety of modifications. A variety of modified examples of the present embodiment will hereinafter be described.

Figure 18:
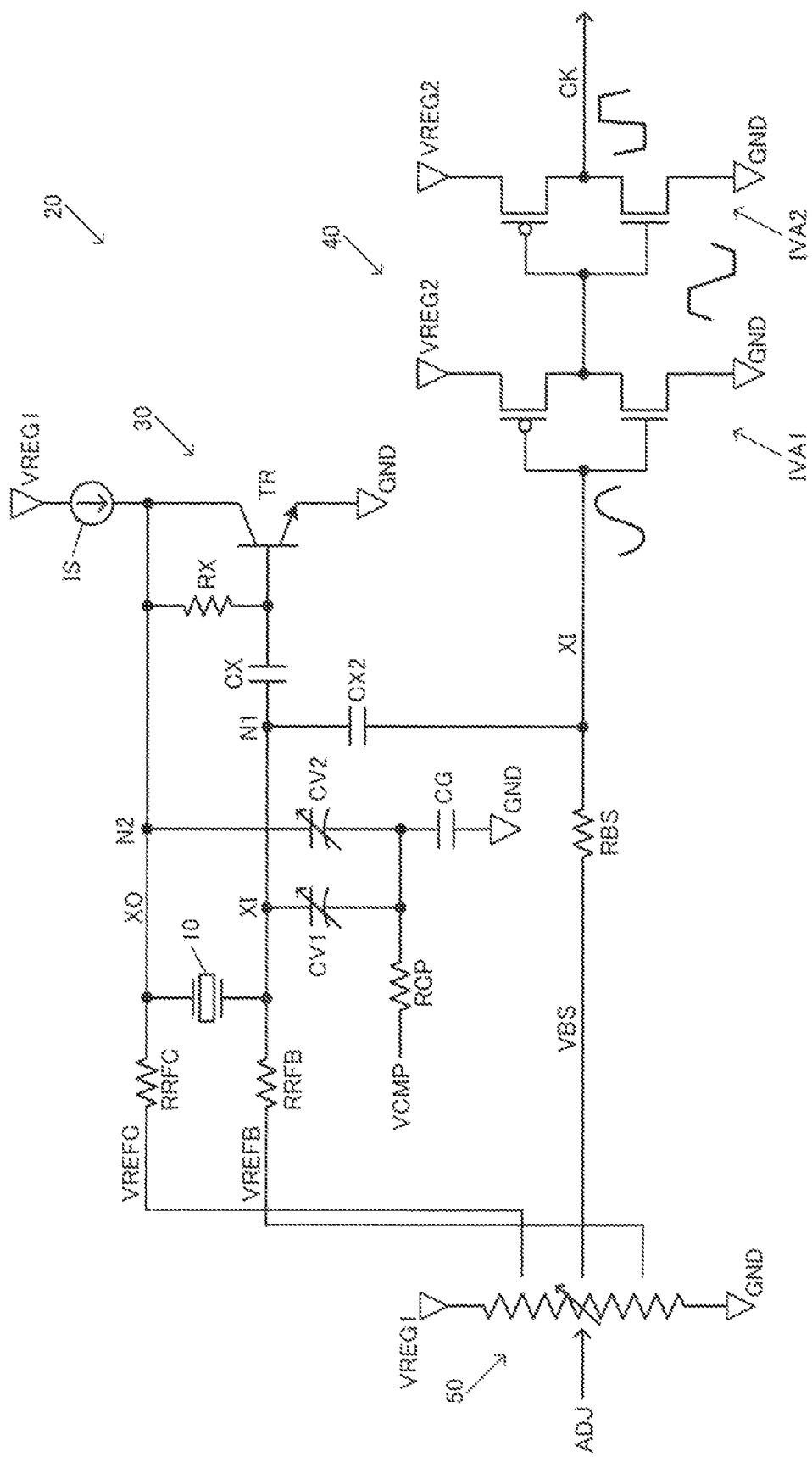
FIG. 18 is a diagram showing a modified example of the circuit device according to the embodiment.

For example, in the modified example shown in FIG. 18, the configuration and so on of the oscillation circuit 30 are different from those shown in FIG. 3. For example, in FIG. 18, the capacitors CF1, CF2 having the stationary capacitances shown in FIG. 3 are not disposed. Further, one end of the variable capacitance element CV1 is coupled to the first node N1, and the other end of the variable capacitance element CV1 is supplied with the temperature compensation voltage VCMP. Further, one end of the variable capacitance element CV2 is coupled to the second node N2, and the other end of the variable capacitance element CV2 is supplied with the temperature compensation voltage VCMP. Further, the first node N1 is supplied with a reference voltage VREFB from the first duty adjustment circuit 50 via a resistance RRFB, and the second node N2 is supplied with a reference voltage VREFC from the first duty adjustment circuit 50 via a resistance RRFC. Thus, a voltage corresponding to a voltage difference between the temperature compensation voltage VCMP and the reference voltage VREFB becomes to be applied to the both ends of the variable capacitance element CV1, and a voltage corresponding to the voltage difference between the temperature compensation voltage VCMP and the reference voltage VREFC becomes to be applied to the both ends of the variable capacitance element CV2. Further, the oscillation signal XI becomes an oscillation signal which varies centering on the reference voltage VREFB, and the oscillation signal XO becomes an oscillation signal which varies centering on the reference voltage VREFC. Further, in FIG. 18, a capacitor CX2 for cutting the DC component is disposed between the first node N1 and an input node of the waveform shaping circuit 40. By disposing such a capacitor CX2, only the AC component of the oscillation signal XI becomes to be transmitted toward the waveform shaping circuit 40 with the DC component thereof cut. Further, the bias voltage VBS forming the bias point is set by the first duty adjustment circuit 50 with respect to the signal of the AC component of the oscillation signal XI, and it becomes possible to input the oscillation signal XI which varies centering on the bias voltage VBS to the waveform shaping circuit 40.

It should be noted that the configuration of the first duty adjustment circuit 50 is not limited to the configurations shown in FIG. 3, FIG. 18 and so on, but a variety of practical modifications can be adopted. For example, circuits having the configurations described as the first comparative example and the second comparative example shown in FIG. 7 and FIG. 8 can be adopted as the first duty adjustment circuit 50.

Figure 19:
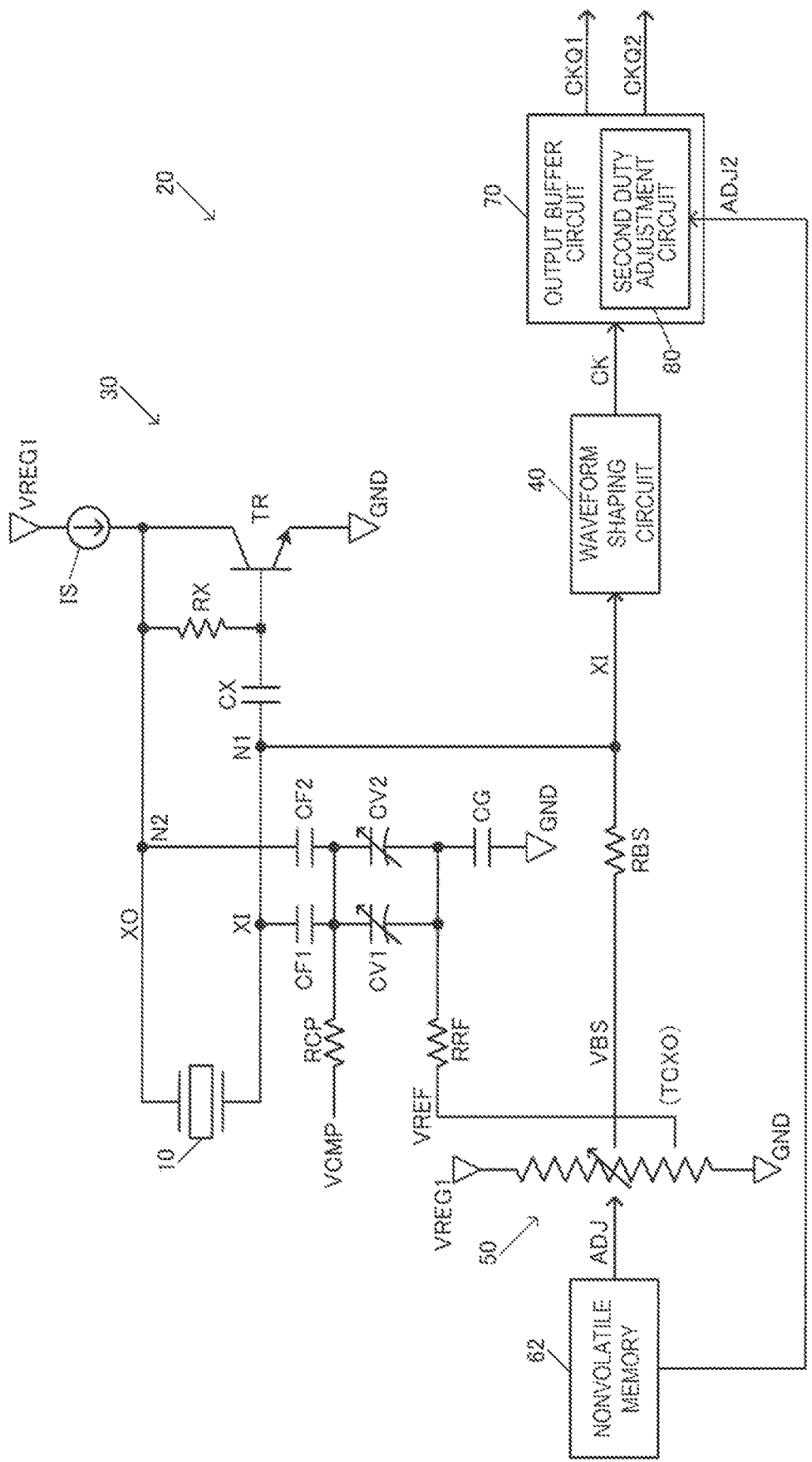
FIG. 19 is a diagram showing a modified example of the circuit device according to the embodiment.
Figure 20:
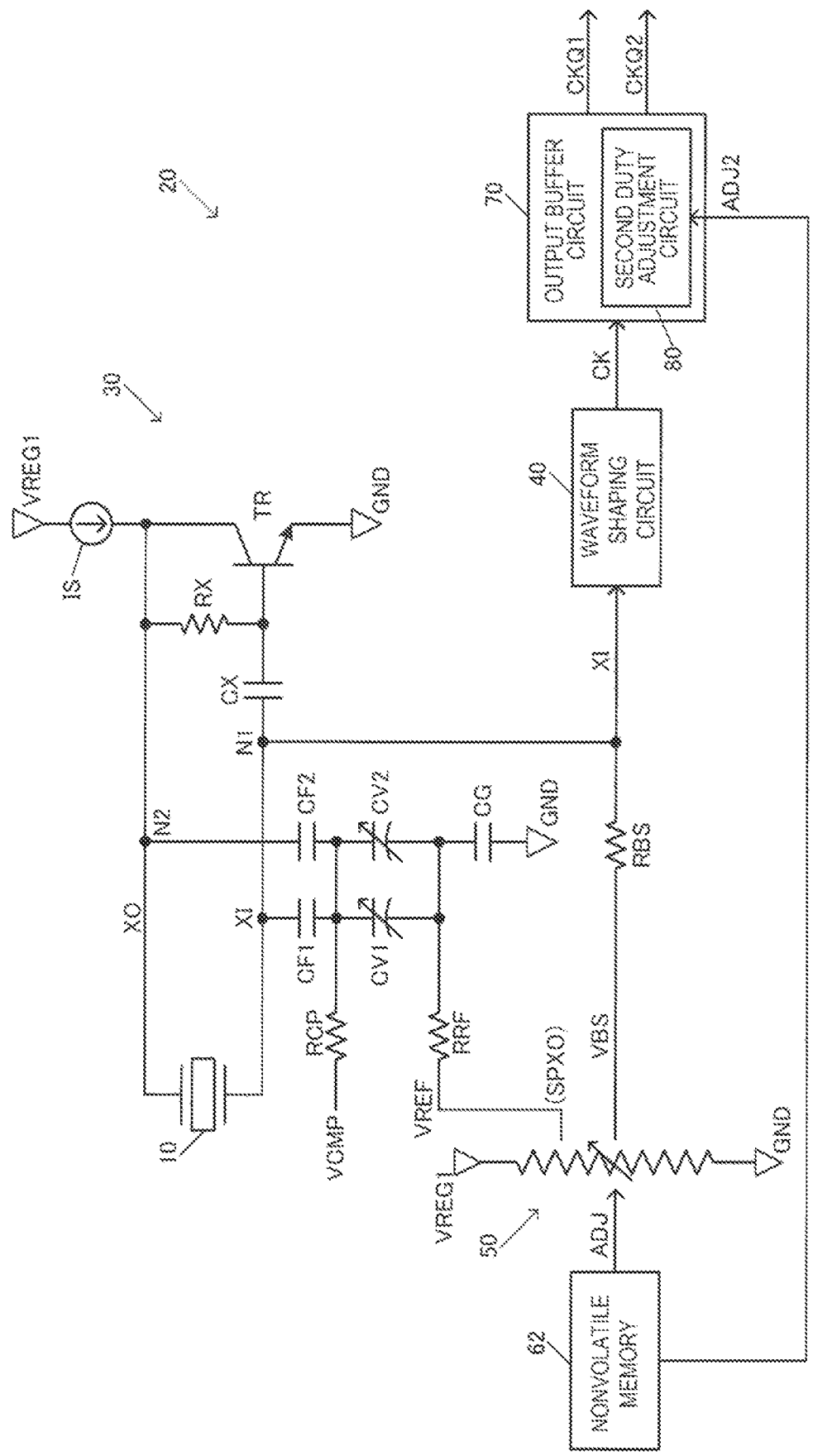
FIG. 20 is a diagram showing a modified example of the circuit device according to the embodiment.

In FIG. 19 and FIG. 20, the circuit device 20 includes the output buffer circuit 70 which buffers the clock signal CK and then outputs the clock signal CK to the outside as the output clock signals CKQ1, CKQ2. The output buffer circuit 70 has a buffer circuit higher in drive capacity than, for example, the waveform shaping circuit 40, and the signal obtained by buffering the clock signal CK with the buffer circuit high in drive capacity is output to the outside of the circuit device 20 as the output clock signals CKQ1, CKQ2. In this way, even when the external load is heavy, it becomes possible to supply the output clock signals CKQ1, CKQ2 having appropriate drive waveforms to the external load to drive the external load.

Further, in FIG. 19, denoting the temperature compensation voltage by VCMP and the reference voltage by VREF, the first duty adjustment circuit 50 supplies the reference voltage VREF with which VCMP-VREF becomes higher than 0 V. The reference voltage VREF is supplied so that, for example, a voltage higher than 0 V is applied to the variable capacitance element CV1. Similarly, the reference voltage VREF is supplied so that a voltage higher than 0 V is applied to the variable capacitance element CV2.

In FIG. 19, the temperature compensation voltage VCMP becomes a voltage which varies in a third-order characteristic or the like in accordance with the temperature centering on, for example, 0.9 V. Further, the first duty adjustment circuit 50 supplies the variable capacitance element CV1 with the reference voltage VREF of, for example, 0.3 V in FIG. 19 so that VCMP-VREF becomes higher than 0 V. Thus, the voltage VCMP-VREF higher than 0 V becomes to be applied to the variable capacitance element CV1. Therefore, the capacitance of the variable capacitance element CV1 becomes to variably change in accordance with the temperature compensation voltage VCMP within an appropriate sensitivity range. Similarly, the voltage VCMP-VREF higher than 0 V also becomes to be applied to the variable capacitance element CV2, and thus, the capacitance of the variable capacitance element CV2 becomes to variably change in accordance with the temperature compensation voltage VCMP within an appropriate sensitivity range. Thus, it becomes possible to use the circuit device 20 as a circuit device for the TCXO, and thus, it becomes possible to realize an oscillator as the TCXO.

In contrast, in FIG. 20, the first duty adjustment circuit 50 supplies the reference voltage VREF with which VCMP-VREF becomes no higher than 0 V. The reference voltage VREF is supplied so that, for example, a voltage no higher than 0 V is applied to the variable capacitance element CV1. Similarly, the reference voltage VREF is supplied so that a voltage no higher than 0 V is applied to the variable capacitance element CV2. In FIG. 20, the temperature compensation voltage VCMP of, for example, about 0.6 V is supplied. Therefore, the first duty adjustment circuit 50 supplies the variable capacitance element CV1 with the reference voltage VREF of, for example, 0.9 V in FIG. 20 so that VCMP-VREF becomes no higher than 0 V. Thus, the voltage VCMP-VREF no higher than 0 V becomes to be applied to the variable capacitance element CV1. Similarly, the voltage VCMP-VREF no higher than 0 V also becomes to be applied to the variable capacitance element CV2. Thus, it becomes possible to use the circuit device 20 as a circuit device for the SPXO, and thus, it becomes possible to realize an oscillator as the SPXO.

For example, the first duty adjustment circuit 50 supplies a voltage of about 0.5 V±0.1 V as the bias voltage VBS. Therefore, in FIG. 19 in which the TCXO is realized, a voltage-dividing tap from which the reference voltage VREF is output in the ladder resistance circuit of the voltage-dividing circuit 52 becomes a tap at the ground node side of the voltage-dividing tap from which the bias voltage VBS is output. In contrast, in FIG. 20 in which the SPXO is realized, the voltage-dividing tap from which the reference voltage VREF is output in the ladder resistance circuit of the voltage-dividing circuit 52 becomes a tap at the VREG1 power supply node side of the voltage-dividing tap from which the bias voltage VBS is output. As described above, according to the present embodiment, only by switching the position of the voltage-dividing tap, from which the bias voltage VBS is output, in the ladder resistance circuit of the voltage-dividing circuit 52, it becomes possible to use the same circuit device 20 as the circuit device for the TCXO as shown in FIG. 19, or as the circuit device for the SPXO as shown in FIG. 20. Therefore, it becomes possible to use the circuit device 20 in common to the TCXO and the SPXO.

Figure 21:
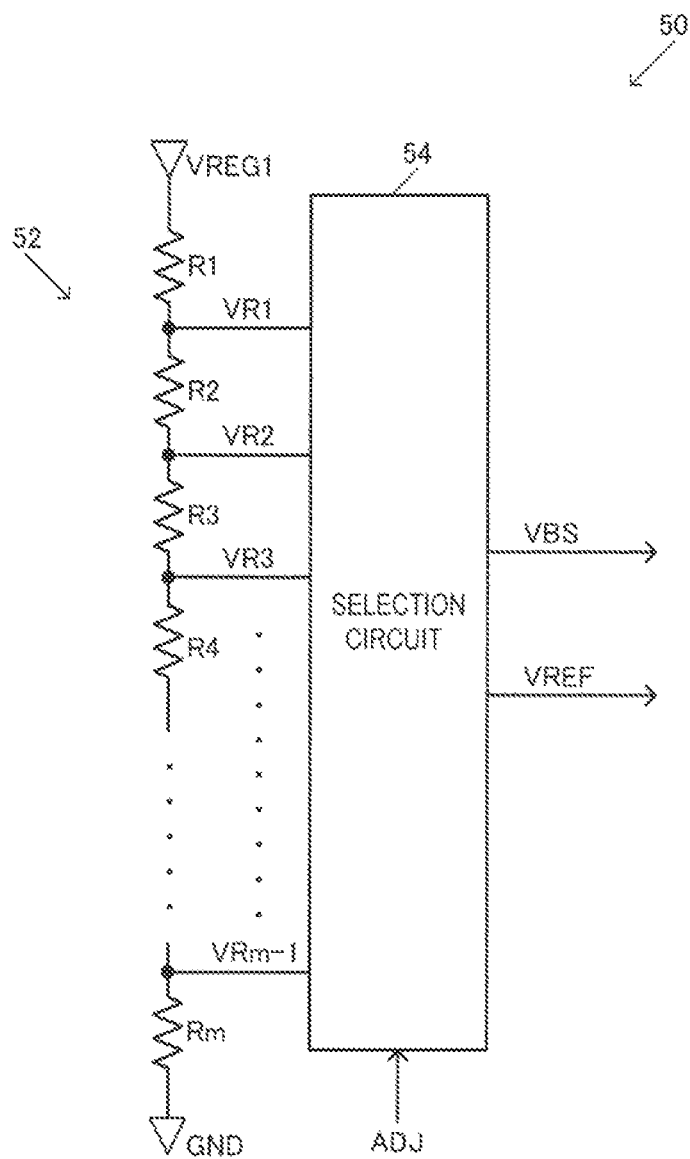
FIG. 21 is a diagram showing a configuration example of the first duty adjustment circuit.

FIG. 21 shows a configuration example of the first duty adjustment circuit 50. The first duty adjustment circuit 50 includes the voltage-dividing circuit 52 and the selection circuit 54. The voltage-dividing circuit 52 has a plurality of resistors R1 through Rm coupled in series between the power supply node of the power supply voltage VREG1 and the ground node, and outputs a plurality of divisional voltages VR1 through VRm-1 divided in voltage by the plurality of resistors R1 through Rm. Further, the selection circuit 54 selects any one of the divisional voltages VR1 through VRm-1 as the bias voltage VBS based on the adjustment data ADJ. This selection circuit 54 can be realized by a plurality of selector circuits for performing the voltage selection using, for example, a tournament method. Specifically, the selection circuit 54 selects the first divisional voltage which is one of the divisional voltages VR1 through VRm-1 as the bias voltage VBS, selects the second divisional voltage which is one of the divisional voltages VR1 through VRm-1 as the reference voltage VREF, and outputs the selected voltages. Thus, it becomes possible to supply both of the bias voltage VBS for the duty adjustment and the reference voltage VREF for the temperature compensation using the single first duty adjustment circuit 50, and thus, it becomes possible to achieve the commoditization of the circuit.

5. Oscillator

Figure 22:
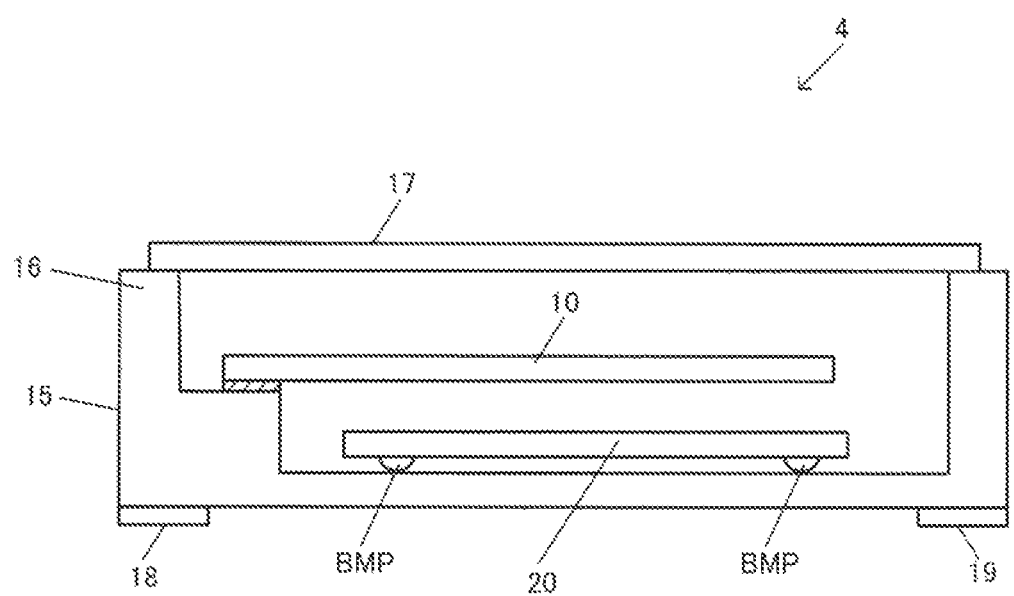
FIG. 22 is a diagram showing a structural example of an oscillator.

FIG. 22 shows a configuration example of the oscillator 4 according to the present embodiment. The oscillator 4 has the resonator 10, the circuit device 20, and a package 15 for housing the resonator 10 and the circuit device 20. The package 15 is formed of, for example, ceramics, and has a housing space inside, and houses the resonator 10 and the circuit device 20 in the housing space. The housing space is airtightly sealed, and is set to a reduced-pressure state, desirably a state approximate to a vacuum state. Due to the package 15, it is possible to protect the resonator 10 and the circuit device 20 from an impact, dust, heat, moisture, and so on in good condition.

The package 15 has a base 16 and a lid 17. Specifically, the package 15 is constituted by the base 16 for supporting the resonator 10 and the circuit device 20, and the lid 17 bonded to the upper surface of the base 16 so that the housing space is formed between the base 16 and the lid 17. Further, the resonator 10 is supported by a step part disposed inside the base 16 via terminal electrodes.

Further, the circuit device 20 is disposed on the inner bottom surface of the base 16. Specifically, the circuit device 20 is disposed so that an active surface faces to the inner bottom surface of the base 16. The active surface is a surface on which the circuit elements of the circuit device are formed. Further, bumps BMP are provided to the terminals of the circuit device 20. Further, the circuit device 20 is supported by the inner bottom surface of the base 16 via the bumps BMP having electrical conductivity. The bumps BMP having electrical conductivity are, for example, metal bumps, and the resonator 10 and the circuit device 20 are electrically coupled to each other via the bumps BMP, internal interconnections and the terminal electrodes of the package 15, and so on. Further, the circuit device 20 is electrically coupled to external terminals 18, 19 of the oscillator 4 via the bumps BMP and the internal interconnections of the package 15. The external terminals 18, 19 are formed on the outer bottom surface of the package 15. The external terminals 18, 19 are coupled to an external device via external wiring. The external wiring is, for example, interconnections provided to the circuit board on which the external device is mounted. Thus, it becomes possible to output the clock signal and so on to the external device.

It should be noted that although in FIG. 22, the circuit device 20 is flip-mounted so that the active surface of the circuit device 20 faces downward, the present embodiment is not limited to such a mounting arrangement. It is possible to mount the circuit device 20 so that, for example, the active surface of the circuit device 20 faces upward. In other words, the circuit device 20 is mounted so that the active surface is opposed to the resonator 10. Alternatively, the oscillator 4 can be an oscillator in a wafer-level package (WLP). In this case, the oscillator 4 includes a base having a semiconductor substrate, and through electrodes penetrating the semiconductor substrate between a first surface and a second surface thereof, the resonator 10 fixed to the first surface of the semiconductor substrate via an electrically conductive bonding members such as metal bumps, and external terminals disposed at the second surface side of the semiconductor substrate via an insulating layer such as a relocation wiring layer. Further, an integrated circuit forming the circuit device 20 is formed on the first surface or the second surface of the semiconductor substrate. In this case, a first semiconductor wafer provided with a plurality of bases on which the resonator 10 and the integrated circuit are disposed, and a second semiconductor wafer provided with a plurality of lids are bonded to each other to thereby bond the plurality of bases and the plurality of lids to each other, and then, segmentalization of the oscillators 4 is performed with a dicing saw or the like. In this way, it becomes possible to realize the oscillator 4 in the wafer-level package, and thus, it becomes possible to manufacture the oscillator 4 with high throughput and at low cost.

As described hereinabove, the circuit device according to the present embodiment includes an oscillation circuit which is electrically coupled to a first node to electrically be coupled to one end of a resonator and a second node to electrically be coupled to another end of the resonator, and is configured to oscillate the resonator to generate an oscillation signal, a waveform shaping circuit which is coupled to the first node, to which the oscillation signal is input from the first node, and which is configured to output a clock signal obtained by performing waveform shaping on the oscillation signal, and a first duty adjustment circuit configured to perform a duty adjustment of the clock signal. Further, the circuit device includes an output buffer circuit configured to output a first output clock signal and a second output clock signal to an outside based on the clock signal, and the output buffer circuit includes a second duty adjustment circuit configured to perform a duty adjustment of the second output clock signal.

In the present embodiment, the oscillation signal is generated by the oscillation circuit oscillating the resonator electrically coupled thereto via the first node and the second node, the oscillation signal at the first node is input to the waveform shaping circuit to be shaped in waveform, and thus, the clock signal is generated. Further, the output buffer circuit outputs the first output clock signal and the second output clock signal to the outside based on the clock signal.

Further, the first duty adjustment circuit performs the duty adjustment of the clock signal, and the second duty adjustment circuit provided to the output buffer circuit performs the duty adjustment of the second output clock signal. In this way, it becomes possible to achieve a two-stage duty adjustment in which the duty adjustment by the first duty adjustment circuit is performed, and at the same time, the duty adjustment by the second duty adjustment circuit is performed. Therefore, in such a situation that, for example, the required specification of the duty accuracy of the second output clock signal is not fulfilled by the duty adjustment by the first duty adjustment circuit, it becomes possible to arrange to fulfill the required specification of the duty accuracy with respect to the second output clock signal using the duty adjustment by the second duty adjustment circuit. Therefore, it becomes possible to realize both of the multi-output function of the clock signal and the high-accuracy duty adjustment.

Further, in the present embodiment, the first output clock signal and the second output clock signal may be clock signals different in phase as much as 180 degrees from each other.

In this way, it is possible to output the first output clock signal and the second output clock signal different in phase as much as 180 degrees from the first output clock signal to the outside to thereby realize the multi-output function, and at the same time, it becomes possible to output the first output clock signal and the second output clock signal on which the high-accuracy duty adjustment has been performed to the outside.

Further, in the present embodiment, the output buffer circuit may include a first buffer circuit configured to buffer the clock signal to output the clock signal buffered as the first output clock signal, and a second buffer circuit which has the second duty adjustment circuit, and which is configured to buffer the clock signal to output the second output clock signal a duty ratio of which is adjusted by the second duty adjustment circuit.

In this way, it is possible to output the signal obtained by buffering the clock signal to the outside as the first output clock signal by the first buffer circuit, and at the same time, it becomes possible to output the signal which is obtained by buffering the clock signal, and the duty ratio of which is adjusted by the second duty adjustment circuit to the outside as the second output clock signal by the second buffer circuit.

Further, in the present embodiment, the first duty adjustment circuit may supply the first node with a bias voltage which is variably adjusted based on adjustment data to thereby adjust a duty ratio of the clock signal.

In this way, since it becomes possible to adjust the bias voltage of the oscillation signal based on the adjustment data so that the duty ratio of the clock signal becomes optimum to input the oscillation signal to the waveform shaping circuit, it becomes possible to adjust the duty ratio with high accuracy.

Further, in the present embodiment, the second duty adjustment circuit may include a reference inverter circuit configured to output a signal obtained by buffering the clock signal to an output node, and a duty adjusting inverter circuit which is coupled in parallel to the reference inverter circuit, and is configured to output the signal obtained by buffering the clock signal to the output node.

In this way, the duty adjusting inverter circuit is coupled in parallel to the reference inverter circuit, and the clock signal becomes to be buffered, and the duty adjustment of the second output clock signal by the duty adjusting inverter circuit becomes possible.

Further, in the present embodiment, a size of each of a P-type transistor and an N-type transistor constituting the duty adjusting inverter circuit may be made no larger than a half of a size of each of a P-type transistor and an N-type transistor constituting the reference inverter circuit.

In this way, it becomes possible to adjust the drive capacity at the P-type transistor side and the drive capacity at the N-type transistor side by the duty adjusting inverter circuit with reference to the drive capacities of the P-type transistor and the N-type transistor of the reference inverter circuit.

Further, in the present embodiment, the second duty adjustment circuit may include a duty adjusting inverter circuit as a first duty adjusting inverter circuit, and a second duty adjusting inverter circuit which is coupled in parallel to the reference inverter circuit, and is configured to output the signal obtained by buffering the clock signal to the output node. Further, a size of each of a P-type transistor and an N-type transistor constituting the second duty adjusting inverter circuit is made twice as large as a size of each of a P-type transistor and an N-type transistor constituting the first duty adjusting inverter circuit.

In this way, it becomes possible to perform such an adjustment as to add the drive capacities at the P-type transistor side and the N-type transistor side of the first duty adjusting inverter circuit and the second duty adjusting inverter circuit to the drive capacities at the P-type transistor side and the N-type transistor side of the reference inverter circuit, and it is possible to achieve a duty adjustment higher in resolution.

Further, in the present embodiment, the second duty adjustment circuit may include a duty adjusting inverter circuit as a first duty adjusting inverter circuit, and second through n-th duty adjusting inverter circuits (n is an integer no smaller than 3) which are coupled in parallel to the reference inverter circuit, and are each configured to output the signal obtained by buffering the clock signal to the output node. Further, a P-type transistor and an N-type transistor of each of the first through n-th duty adjusting inverter circuits may be controlled by first through n-th control signals so that one of the P-type transistor and the N-type transistor is set to an ON state, and another of the P-type transistor and the N-type transistor is set to an OFF state. Further, sizes of the P-type transistors and the N-type transistors constituting the first through n-th duty adjusting inverter circuits may be binary-weighted.

In this way, it becomes possible to perform such an adjustment as to add the drive capacities at the P-type transistor side and the N-type transistor side of the first through n-th duty adjusting inverter circuits in a binary-weighted manner to the drive capacities at the P-type transistor side and the N-type transistor side of the reference inverter circuit, and it is possible to achieve a duty adjustment higher in resolution.

Further, in the present embodiment, the duty adjusting inverter circuit may include a first P-type transistor and a second P-type transistor coupled in series between a power supply node and the output node, and a first N-type transistor and a second N-type transistor coupled in series between a ground node and the output node. Further, the clock signal may be input to a gate of each of the first P-type transistor and the first N-type transistor, and a common first control signal may be input to a gate of each of the second P-type transistor and the second N-type transistor.

In this way, even when there occurs such imbalance that the drive capacities at the P-type transistor side and the N-type transistor side of the reference inverter circuit lower, by the first duty adjusting inverter circuit adding the drive capacities at the P-type transistor side and the N-type transistor side, it becomes possible to resolve the imbalance, and thus, it becomes possible to realize the high-accuracy duty adjustment.

Further, in the present embodiment, the second duty adjustment circuit may include the duty adjusting inverter circuit as a first duty adjusting inverter circuit, and a second duty adjusting inverter circuit which is coupled in parallel to the reference inverter circuit, and is configured to output the signal obtained by buffering the clock signal to the output node. Further, the second duty adjusting inverter circuit may include a third P-type transistor and a fourth P-type transistor coupled in series between the power supply node and the output node, and a third N-type transistor and a fourth N-type transistor coupled in series between the ground node and the output node. Further, the clock signal may be input to a gate of each of the third P-type transistor and the third N-type transistor, and a common second control signal may be input to a gate of each of the fourth P-type transistor and the fourth N-type transistor.

In this way, even when there occurs such imbalance that the drive capacities at the P-type transistor side and the N-type transistor side of the reference inverter circuit lower, by the first duty adjusting inverter circuit and the second duty adjusting inverter circuit adding the drive capacities at the P-type transistor side and the N-type transistor side, it becomes possible to resolve the imbalance, and thus, it becomes possible to realize the high-accuracy duty adjustment.

Further, the present embodiment relates to an oscillator including the circuit device described above and a resonator.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the present disclosure. Further, the configurations and the operations of the circuit device and the oscillator are not limited to those described in the present embodiment, but can be implemented with a variety of modifications.

What is claimed is:

1. A circuit device comprising:
   an oscillation circuit which is electrically coupled to a first node to electrically be coupled to one end of a resonator and a second node to electrically be coupled to another end of the resonator, and is configured to oscillate the resonator to generate an oscillation signal;
   a waveform shaping circuit which is coupled to the first node, to which the oscillation signal is input from the first node, and which is configured to output a clock signal obtained by performing waveform shaping on the oscillation signal;
   a first duty adjustment circuit configured to perform a duty adjustment of the clock signal; and
   an output buffer circuit configured to output a first output clock signal and a second output clock signal to an outside based on the clock signal, wherein
   the output buffer circuit includes a second duty adjustment circuit configured to perform a duty adjustment of the second output clock signal, and
   the second duty adjustment circuit includes:
      a reference inverter circuit configured to output a signal obtained by buffering the clock signal to an output node; and
      a duty adjusting inverter circuit which is coupled in parallel to the reference inverter circuit, and is configured to output the signal obtained by buffering the clock signal to the output node.

2. The circuit device according to claim 1, wherein
   the first output clock signal and the second output clock signal are clock signals different in phase as much as 180 degrees from each other.

3. The circuit device according to claim 1, wherein
   the output buffer circuit includes:
      a first buffer circuit configured to buffer the clock signal to output the clock signal buffered as the first output clock signal; and
      a second buffer circuit which has the second duty adjustment circuit, and which is configured to buffer the clock signal to output the second output clock signal a duty ratio of which is adjusted by the second duty adjustment circuit.

4. The circuit device according to claim 1, wherein
   the first duty adjustment circuit supplies the first node with a bias voltage which is variably adjusted based on adjustment data to thereby adjust a duty ratio of the clock signal.

5. The circuit device according to claim 1, wherein
   a size of each of a P-type transistor and an N-type transistor constituting the duty adjusting inverter circuit is made no larger than a half of a size of each of a P-type transistor and an N-type transistor constituting the reference inverter circuit.

6. The circuit device according to claim 1, wherein
   the second duty adjustment circuit includes:
      the duty adjusting inverter circuit as a first duty adjusting inverter circuit; and
      a second duty adjusting inverter circuit which is coupled in parallel to the reference inverter circuit, and is configured to output the signal obtained by buffering the clock signal to the output node, and
   a size of each of a P-type transistor and an N-type transistor constituting the second duty adjusting inverter circuit is made twice as large as a size of each of a P-type transistor and an N-type transistor constituting the first duty adjusting inverter circuit.

7. The circuit device according to claim 1, wherein
   the second duty adjustment circuit includes:
      the duty adjusting inverter circuit as a first duty adjusting inverter circuit; and
      second through n-th duty adjusting inverter circuits (n is an integer no smaller than 3) which are coupled in parallel to the reference inverter circuit, and are each configured to output the signal obtained by buffering the clock signal to the output node,
   a P-type transistor and an N-type transistor of each of the first through n-th duty adjusting inverter circuits are controlled by first through n-th control signals so that one of the P-type transistor and the N-type transistor is set to an ON state, and another of the P-type transistor and the N-type transistor is set to an OFF state, and
   sizes of the P-type transistors and the N-type transistors constituting the first through n-th duty adjusting inverter circuits are binary-weighted.

8. The circuit device according to claim 1, wherein
   the duty adjusting inverter circuit includes:
      a first P-type transistor and a second P-type transistor coupled in series between a power supply node and the output node; and
      a first N-type transistor and a second N-type transistor coupled in series between a ground node and the output node,
   the clock signal is input to a gate of each of the first P-type transistor and the first N-type transistor, and
   a common first control signal is input to a gate of each of the second P-type transistor and the second N-type transistor.

9. The circuit device according to claim 8, wherein
   the second duty adjustment circuit includes:
      the duty adjusting inverter circuit as a first duty adjusting inverter circuit; and
      a second duty adjusting inverter circuit which is coupled in parallel to the reference inverter circuit, and is configured to output the signal obtained by buffering the clock signal to the output node,
   the second duty adjusting inverter circuit includes:
      a third P-type transistor and a fourth P-type transistor coupled in series between the power supply node and the output node; and
      a third N-type transistor and a fourth N-type transistor coupled in series between the ground node and the output node,
   the clock signal is input to a gate of each of the third P-type transistor and the third N-type transistor, and a common second control signal is input to a gate of each of the fourth P-type transistor and the fourth N-type transistor.

10. An oscillator comprising:
  a resonator;
  an oscillation circuit which is electrically coupled to a first node to electrically be coupled to one end of the resonator and a second node to electrically be coupled to another end of the resonator, and is configured to oscillate the resonator to generate an oscillation signal;
  a waveform shaping circuit which is coupled to the first node, to which the oscillation signal is input from the first node, and which is configured to output a clock signal obtained by performing waveform shaping on the oscillation signal;
  a first duty adjustment circuit configured to perform a duty adjustment of the clock signal; and
  an output buffer circuit configured to output a first output clock signal and a second output clock signal to an outside based on the clock signal, wherein
  the output buffer circuit includes a second duty adjustment circuit configured to perform a duty adjustment of the second output clock signal, and
  the second duty adjustment circuit includes:
    a reference inverter circuit configured to output a signal obtained by buffering the clock signal to an output node; and
    a duty adjusting inverter circuit which is coupled in parallel to the reference inverter circuit, and is configured to output the signal obtained by buffering the clock signal to the output node.

* * * * *